United States Patent [19]
Yoda

[11] Patent Number: 5,623,425
[45] Date of Patent: Apr. 22, 1997

[54] METHOD OF MANUFACTURING, DETERMINING AND DESIGNING AN OBJECT

[75] Inventor: Kiyoshi Yoda, Hyogo, Japan

[73] Assignee: Mitsubishi Denki Kabushiki Kaisha, Tokyo, Japan

[21] Appl. No.: 307,102

[22] Filed: Sep. 16, 1994

Related U.S. Application Data

[63] Continuation of Ser. No. 978,364, Nov. 18, 1992, abandoned.

[30] Foreign Application Priority Data

Nov. 20, 1991 [JP] Japan ..................... 3-329699
Nov. 11, 1992 [JP] Japan ..................... 4-324685

[51] Int. Cl.$^6$ ..................................... G06F 17/50
[52] U.S. Cl. ................................. 364/553; 364/149
[58] Field of Search ..................... 364/151, 152, 364/553, 554, 578, 148, 149

[56] References Cited

PUBLICATIONS

A.I. Beltzer, "Engineering analysis via symbolic computation—a breakthrough", *Appl. Mech. Rev.*, vol. 43, No. 6, Jun. 1990, pp. 119–127.

K. Yoda, "A Method to Solve Inverse Boundary–Value Problems Using Symbolic Computation", *IUTAM Symposium on Inverse Problems in Engineering Mechanics Abstracts*, IUTAM–92, May 11–15, 1992, Tokyo, Japan, pp. 209–211.

K. Yoda, "Symbolic Computation for Inverse Boundary–Value Problems and its Application to Impedance Tomography Reconstruction", *Digests of the Fifth Biennial IEEE Conference on Electromagnetic Field Computation*, Aug. 3–5, 1992.

K. Yoda, "Forward and Inverse Boundary–Value Problem Solver Using Symbolic Computation", *The International Symposium on Nonlinear Phenomena in Electromagnetic Fields Abstracts,* ISEM–Nagoya, Jan. 26–29, 1992, Nagoya, Japan, pp. 127.

A. I. Beltzer, *Variational and Finite Element Methods,* (Springer–Verlag Berlin Heidelberg, 1990), pp. 195–201.

T. Murai et al., "Electrical Impedance Computed Tomography Based on a Finite Element Model", *IEEE Trans. on Biomedical Engineering,* vol. BME–32, No. 3 (Mar. 1985), pp. 177–184.

P. P. Silvester et al., *Finite Elements for Electrical Engineers,* (Cambridge University, 1990), pp. 1–19.

*Primary Examiner*—Emanuel T. Voeltz
*Assistant Examiner*—Edward Pipala
*Attorney, Agent, or Firm*—Burns, Doane, Swecker & Mathis, LLP

[57] ABSTRACT

Disclosed herein is a method and an apparatus for controlling or determining and estimating an object system which controls or determines parameters for specifying the object system and estimates an internal condition of the object system based on a measured value obtained for the object system. The method and apparatus compute a function characteristic distribution of the object system as a function of variable parameters using a boundary element method or finite element method. An equation is set by making equivalance between the computed distribution and a predetermined distribution. Values of parameters can be obtained by solving the equation.

6 Claims, 23 Drawing Sheets

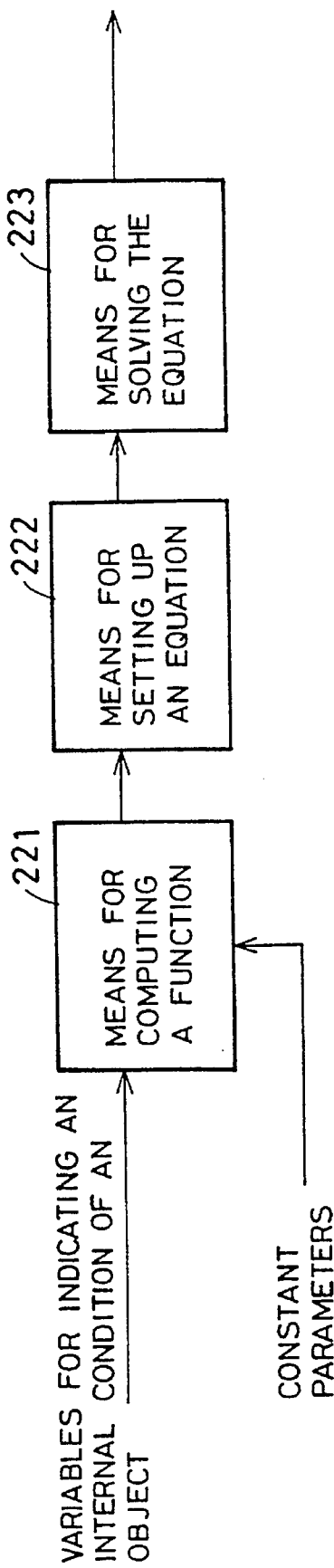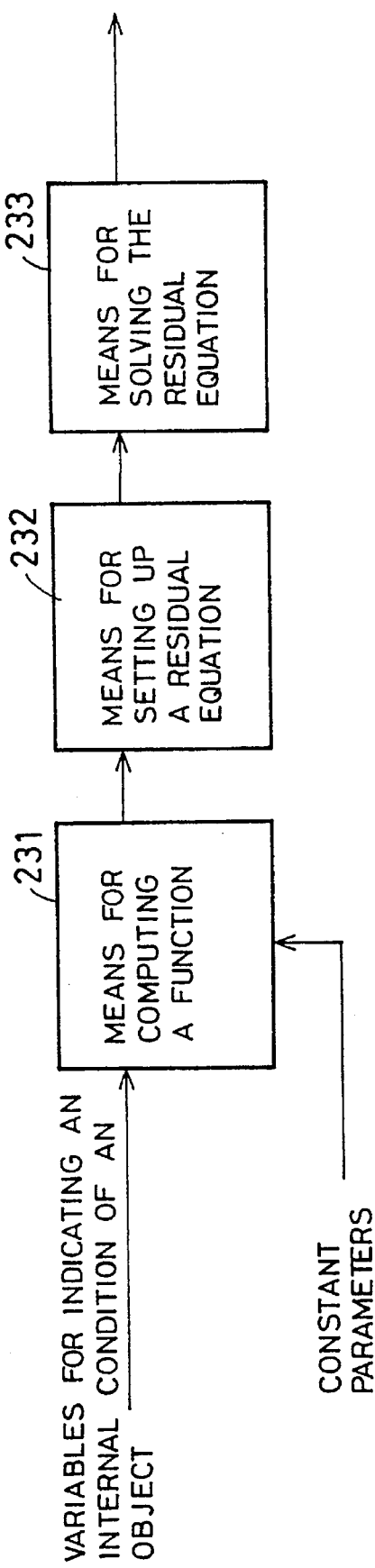

FIG. 16(a)
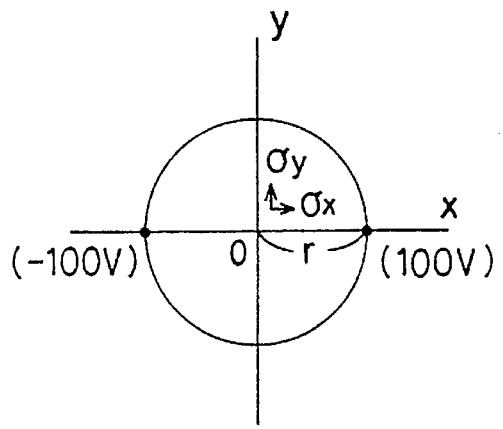
FIG. 16(b)
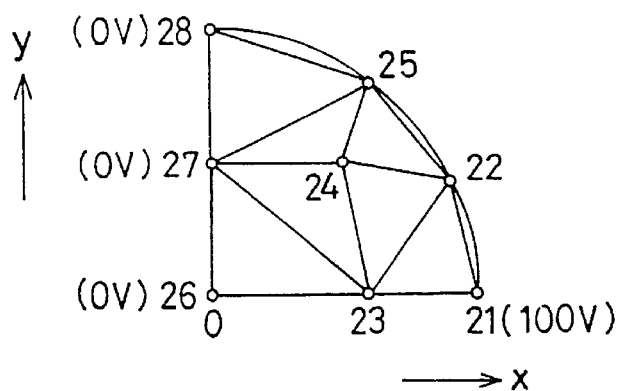
FIG. 16(c)
| NODE No. | COORDINATES (cm) | |
|---|---|---|
| | x | y |
| 21 | 5.0 | 0.0 |
| 22 | d | 2.18 |
| 23 | 3.0 | 0.0 |
| 24 | 2.5 | 2.5 |
| 25 | 3.0 | 4.0 |
| 26 | 0.0 | 0.0 |
| 27 | 0.0 | 2.5 |
| 28 | 0.0 | 5.0 |

41a  41b

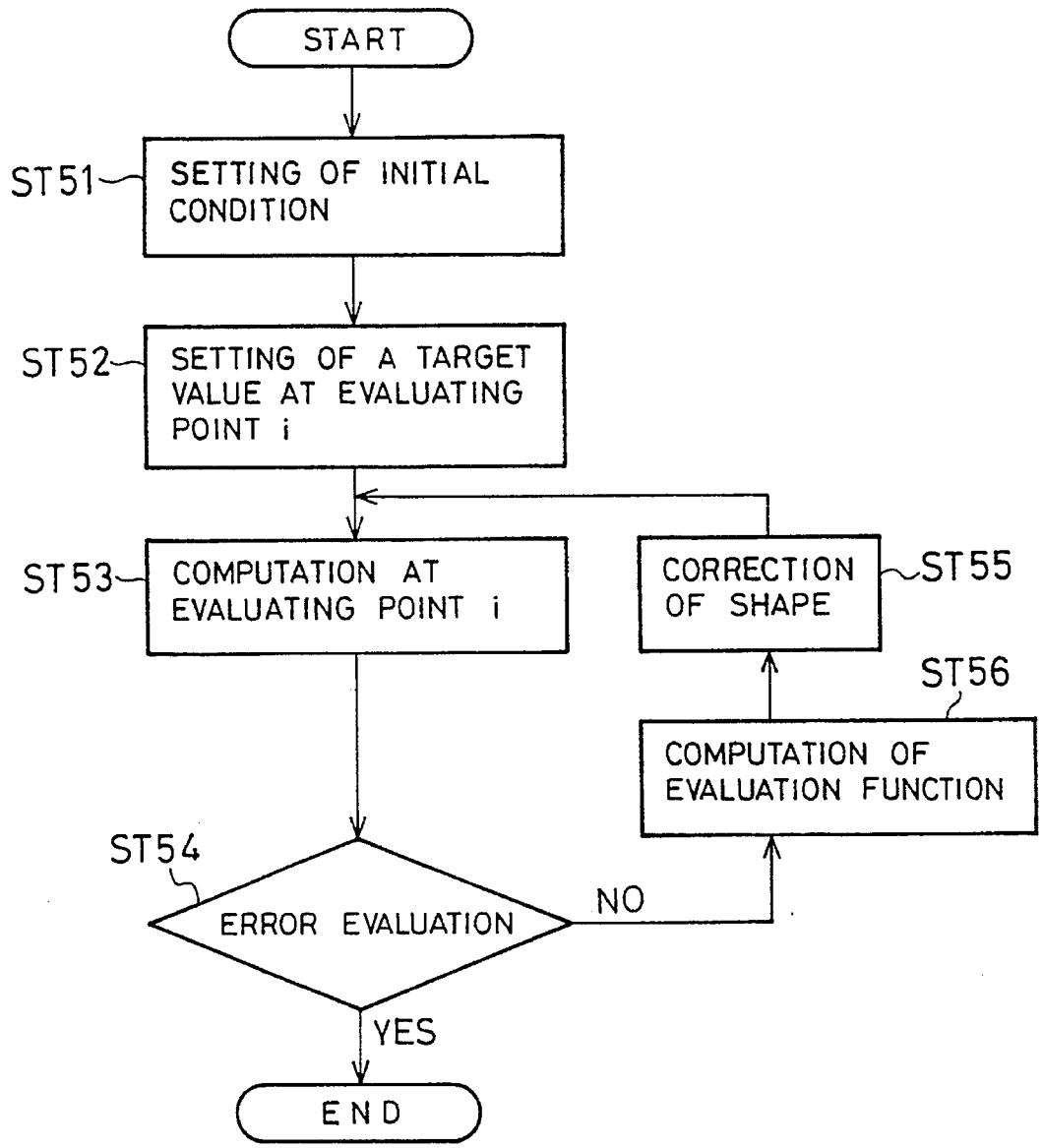

METHOD OF MANUFACTURING, DETERMINING AND DESIGNING AN OBJECT

This application is a continuation of application Ser. No. 07/978,364, filed Nov. 18, 1992 now abandoned.

BACKGROUND OF THE INVENTION

1. Field of the Invention

The present invention relates to a method and an apparatus for controlling or determining and estimating an object system which controls or determines, in order to obtain, for example, predetermined distribution concerning a function characteristic distribution of an object such as magnetic flux distribution and temperature distribution, a parameter for specifying an object such as shape and a physical value of the material and also estimates an internal condition of the object such as a physical value of the material on the basis of a measured value obtained for the object.

2. Description of the Prior Art

FIG. 27 is a flowchart explaining a method for obtaining the predetermined uniform magnetic flux distribution by optimizing the shape of an electromagnet explained on page 393 of the Proceedings of Electric Society in Japan, A No. 9, Vol. 109 (1989). FIG. 28 shows a model under the bidimensional analysis of an electromagnet as an object.

In FIG. 28, the reference numeral 90 denotes a coil to which a current is applied to generate a magnetic field in the gap 93 of a magnetic body 91 and poles 92 of the electromagnet. In this case, the magnetic field distribution in the gap 93 is determined by the shape of the poles 92. Therefore, it is desired to obtain a shape of the poles 92 which unifies as much as possible the magnetic flux density in the y direction of evaluation region 94 enclosed by a dotted line in the gap 93. Now, the electromagnet is assumed to be placed within the air region.

Operations will then be explained. In this case, the shape of poles 92 is a parameter which specifies an object and the predetermined function characteristic distribution is a uniform magnetic field distribution. Moreover, a boundary element method is used as an analysis method in the above reference. The boundary element method is used for analyzing the characteristics of a complicated analysis object through a division of elements on the boundary using the boundary element equation.

First, the initial condition is set (step ST51). This includes setting of the initial condition means, setting of coordinates of each node and setting of physical values of a material in each boundary element when the analysis object is divided into a finite number of boundary elements. In this case, the initial shape of poles 92 is set to a flat shape as shown in FIG. 20(a).

Next, a target value in the finite number of evaluating points i (i=1, . . . , M) within the evaluating region 94, namely a value of the predetermined uniform magnetic field in this case, is set (step ST52). Next, a y element of the magnetic field in the M evaluating points is calculated by the boundary element method (step ST53). Moreover, a sum of the squares of the errors between the calculated values and the target values in the M evaluating points is calculated and error evaluation is conducted for this sum of the squares (step ST 54).

When an error is the predetermined value or less, processing is completed and if not, calculation of the evaluating function described in the above reference is conducted (step ST56). In addition, the amount of correction of the shape of poles 92 is determined by using the calculation result of the evaluating function (step ST55). The boundary element analysis is executed again for the corrected shape to calculate the y element in the evaluating point (step ST53).

The shape of poles 92 is converted to that suitable for predetermined uniform magnetic field distribution by repeating the processings of the steps ST 53 to ST 55 several times, namely repeating the boundary element analysis as explained above. FIG. 29 shows a converging process of the shape of poles 92. In this figure, (a)~(f) show the shape of poles 92 corresponding to the number of times of repetition of the boundary element analysis. Namely, these illustrations show a profile where a relative error of the generated magnetic field for the target magnetic field is reduced with the increase in the number of times of repetition.

FIG. 30 illustrates a sectional view of a cross-sectional model of the chest portion of a human body for obtaining the distribution of conductivity within a human body described in the IEEE Transaction on Biomedial Engineering, Vol. BME-32, No. 3, 1985). A method of obtaining the distribution of conductivity within a human body is an example of a method for estimating an internal condition of an object from the measured values of the object. In this case, distribution of conductivity shows an internal condition of an object.

The chest portion of a human body includes lungs (dotted regions in FIG. 30) and conductivity is largely different in the spaces. Therefore, as shown in FIG. 30, when a current is applied externally, distribution of the conductivity within a human body can be estimated by measuring voltages generated at the surface of a human body at many points. It is called a impedance CT problem.

For the processings, the interior of a human body is divided into triangular elements as shown in FIG. 30 and the conductivity of each element is supposed as $\sigma i$ (i=1, . . . , M). The processing procedures are similar to that shown in the flowchart of FIG. 27. First, the initial condition is set. Namely, the coordinates of each node 101~120 is set and a node to which a current is applied is determined. For example, it is assumed that a current is applied across the nodes 101 and 111. Moreover, the initial value of the conductivity $\sigma i$ of each element is set.

Next, potential values at the surface of a human body, namely potential values at the nodes 102~110, 111~120 are computed. The finite element method is an approximate solution method in which an interior analysis of an object having a complicated shape and distribution of physical value is divided into finite number of elements and a physical condition assigned to each element is calculated based on the principle of energy minimization. As a result of the analysis by the finite element method, the potential at each node can be computed in this case.

Here, an error between the computed node potential and the actually measured node potential is evaluated. If an error exceeds the predetermined value, the conductivity $\sigma i$ (i=1, . . , M) of each element is corrected using the evaluation result and analysis by the finite element method is executed again using the corrected conductivity $\sigma i$ of each element. Moreover, such processings are repeated until an error between the computed node potential and the measured node potential becomes the predetermined value or less, for example, until a sum of the squares of the error becomes the predetermined value or less.

FIG. 31 shows a profile where a mean value of estimated errors, namely a mean value of the error between the computed node potential and the measured node potential is reduced as the number of times of repetition of analysis by the finite element method increases.

Since a conventional method and apparatus for controlling or determining and estimating an object system is configured as explained above, if the initial condition (the initial shape or distribution of initial physical value) is largely deviated from the final condition (final shape or distribution of true physical value), such method and apparatus shows a problem that the number of times of repetitive computation of the boundary element method and finite element method increases and the time rquired until the final condition is obtained becomes longer. It is because the time required for single execution of the boundary element method and finite element method is considerably longer.

Moreover, there lies a problem that it is probable that the processing will be completed, in the error evaluation, before the true error is minimized when many local minimum values exist. For example, as shown in FIG. 32, when a parameter value at the point C is employed as the initial value of the parameter which specifies an object, an error can be set to the minimum true value. However, when a parameter value at the point A or B is employed as the initial value, an erroneous parameter is determined as the parameter in the final condition.

SUMMARY OF THE INVENTION

The present invention has been proposed to solve the problems explained above.

It is a first object of the present invention to provide a method and an apparatus for controlling or determining and estimating an object system which curtails a time period required until obtaining parameters for realizing a predetermined function characteristic distribution or a time period required until obtaining the internal condition of an object which minimizes an error.

It is a second object of the present invention to provide a method and an apparatus for controlling or determining and estimating an object system for preventing use of erroneous parameters as the optimum parameters and acquisition of erroneous internal condition as the estimated value of true internal condition.

In order to achieve the objects explained above, following the operations are carried out for controlling or determining the object system in the present invention.
(1) At least one parameter among those for specifying an object is chosen as a variable.
(2) A function characteristic distribution of an object is computed as a function of such variables.
(3) The computed function characteristic distribution is equalized to that is, equated to the predetermined function characteristic distribution and thereby an equation including variables of such distributions are generated.
(4) A parameter for realizing the predetermined function characteristic distribution is controlled or determined by solving such an equation.

Moreover, the following operations are carried out for estimation of the object system in the present invention.
(1) An internal condition of an object is used as a variable.
(2) A distribution of physical amount which can be measured for such object is computed as a function of a variable.
(3) The computed distribution of physical value and actually measured distribution of physical value are equalized and an equation including a variable is generated.
(4) An internal condition of an object can be estimated by solving such an equation.

BRIEF DESCRIPTION OF THE DRAWINGS

FIG. 8 is a block diagram showing an apparatus for estimating an object system according to an embodiment of the present invention;

FIG. 9 is a block diagram showing an apparatus for estimating an object system according to an embodiment of the present invention;

FIGS. 16(a), 16(b) and 16(c) are explanatory view, showing a disk type conductor model;

FIG. 27 is a flowchart for showing the process in the conventional method of determining parameters of an object;

DETAILED DESCRIPTION OF THE PREFERRED EMBODIMENTS

The preferred embodiments of the present invention will be explained in detail with reference to the accompanying drawings.

Figure 1:
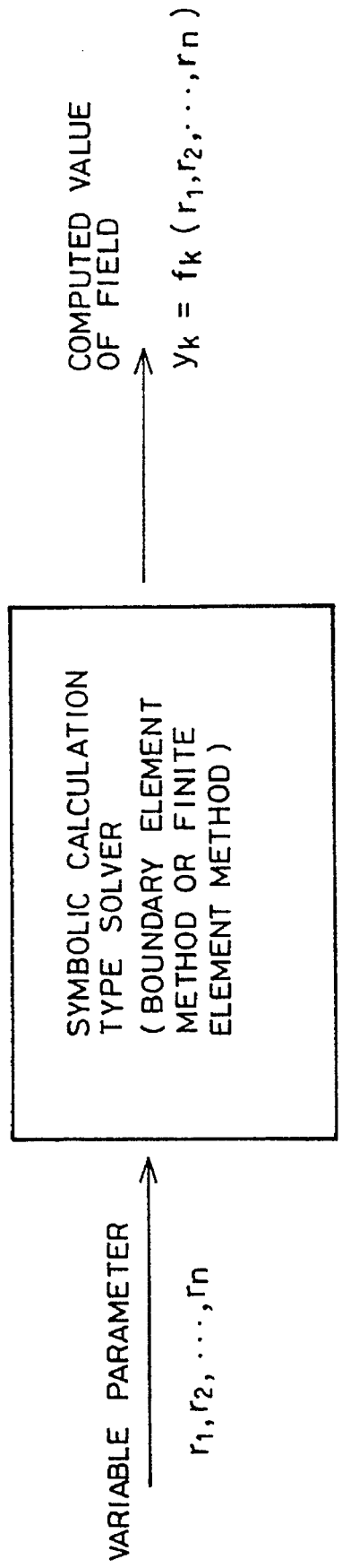
FIG. 1 is an explanatory view for explaining a basic concept of the present invention.

The basic concept of each embodiment is explained first. FIG. 1 shows the basic concept of the present invention. When one or more variable parameters $r_1, \ldots, r_n$ ($n \geq 1$) are input in the computation procedures (SOLVER) of the boundary element method or finite element method, computed values $y_k = f_k (r_1, \ldots, r_n)$ (k is a number of space coordinates for computing a function characteristic distribution, $k \geq 1$) of the function characteristic distribution (field) are output.

The computation procedure (SOLVER) has been of a numerical calculation type but here it is of a code calculation type. As the computer language which enables code calculation, a language called "Mathemetica" is known.

For example, coordinate values specifying a shape and physical value of material specifying a nature of an object are considered as the variable parameters. Moreover, as an example of a function characteristic distribution as a calculation output, an electromagnetic apparatus has electric field distribution, magnetic field distribution, electromagnetic field distribution, potential distribution and intrinsic frequency, etc. A mechanically configured apparatus has stress distribution, strain energy, displacement distribution and intrinsic number of vibrations, etc. Moreover, a heat utilizing apparatus has temperature distribution and thermal flow flux distribution, etc. A fluid utilizing apparatus has flow rate distribution, flow line distribution and pressure distribution, etc.

As shown in FIG. 1, the computed value $y_k$ is a function of a variable parameter $r_k$. An input of SOLVER has been a practical value and a computed value is also a practical value. The error evaluation has been conducted for the computed value and the value corrected depending on the evaluation result has been input again to SOLVER.

However, in this case, a computed value $y_k$ of the function characteristic distribution including unknown functions is obtained and a parameter value for optimizing the shape and physical values of an object can be determined using such a computed value $y_k$. Namely, the optimum design for the shape and physical value of an object can be realized without repetitive execution of the boundary element method or finite element method.

Therefore, when a computer is used, the computing time can be curtailed in comparison with that of the conventional method. Moreover, the conventional method has a disadvantage that the computation accuracy is lowered due to carrying and rounding of digits generated in the course of the computation. In the case the values to be processed range from a small value to a very large value, it is probable that a very small value becomes 0. However, according to the present invention, such possibility does not exist since symbols are used in the course of computation and accuracy is determined only by the finally executed computation of numerals.

A method and an apparatus of the present invention will be explained hereunder in further detail with reference to FIGS. 2 to 5 and FIGS. 6 to 9. As explained above, namely, in the step ST1 and step ST2, the variable parameters $r_1, \ldots, r_n$ are selected by the means 201 for computing a function shown in FIG. 6 and a computed value $y_k$ of the function distribution can be obtained by the boundary element method or finite element method.

A designer for executing the optimum design of an object gives a desired distribution $y_{1\,a}, \ldots, y_{n\,a}$ ($n \geq 1$) at the n points. When n variable parameters are selected, the following simultaneous equations (1) can be obtained by the means 202 for computing the equation shown in FIG. 6 in the step ST2 in FIG. 2.

$$y_{1_a} = f_1(r_1, \ldots, r_n) \qquad (1)$$
$$y_{2_a} = f_2(r_1, \ldots, r_n)$$
$$y_{3_a} = f_3(r_1, \ldots, r_n)$$
$$\cdot$$
$$\cdot$$
$$\cdot$$
$$y_{na} = f_n(r_1, \ldots, r_n)$$

This simultaneous equation is composed of n equations and n unknown values are included. Therefore, this simultaneous equation can be solved. Namely, the optimum values of variable parameters $r_1, \ldots, r_n$ can be obtained by solving the equation (1) with the means 203 for solving the equation of FIG. 6 in the step ST4 in FIG. 2. In the method explained above, values of the variable parameters are determined by equalizing or equating a computed value $Y_k$ and the values indicating the predetermined function characteristic distribution. However, as shown in FIG. 3, each value which minimizes the residual sum of the squares of the computed value $y_k$ and the predetermined function characteristic distribution can be determined an unknown value by the minimum square method.

Figure 7:
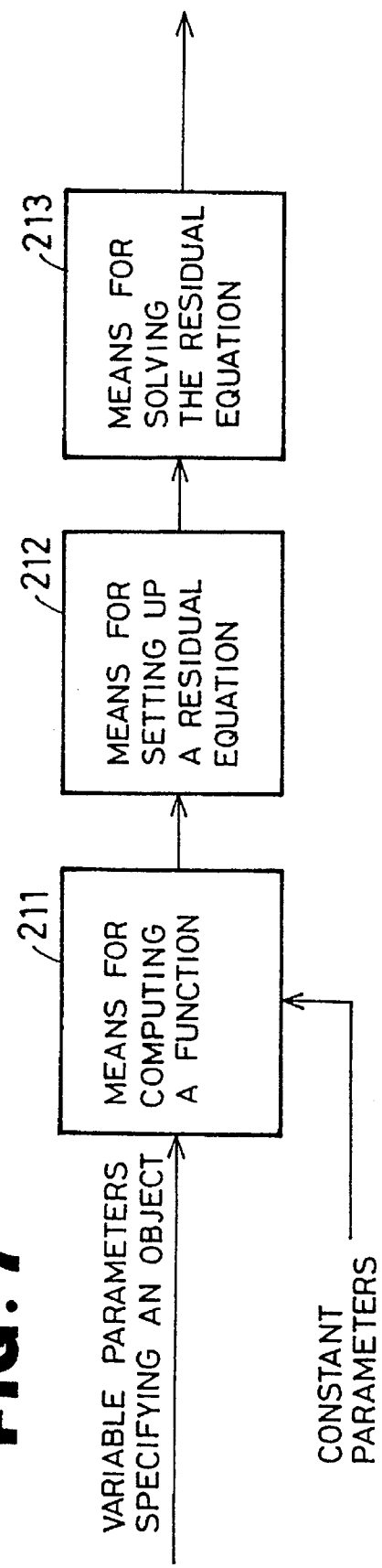
FIG. 7 is a block diagram showing an apparatus for controlling or determining an object system according to an embodiment of the present invention.

Namely, in the step ST11 and ST12, variable parameters $r_1, \ldots, r_n$ are selected by the means 211 for computing the function of FIG. 7 and a computed value $y_k$ can be obtained. Thereafter, in the step ST13 of FIG. 3, an equation (2) for indicating the residual sum of the squares is obtained by the means 212 for computing a residual equation of FIG. 7.

$$\epsilon = \sum_k \{y_{ka} - f_k(r_1, \ldots, r_n)\}^2 \quad (2)$$

Figure 3:
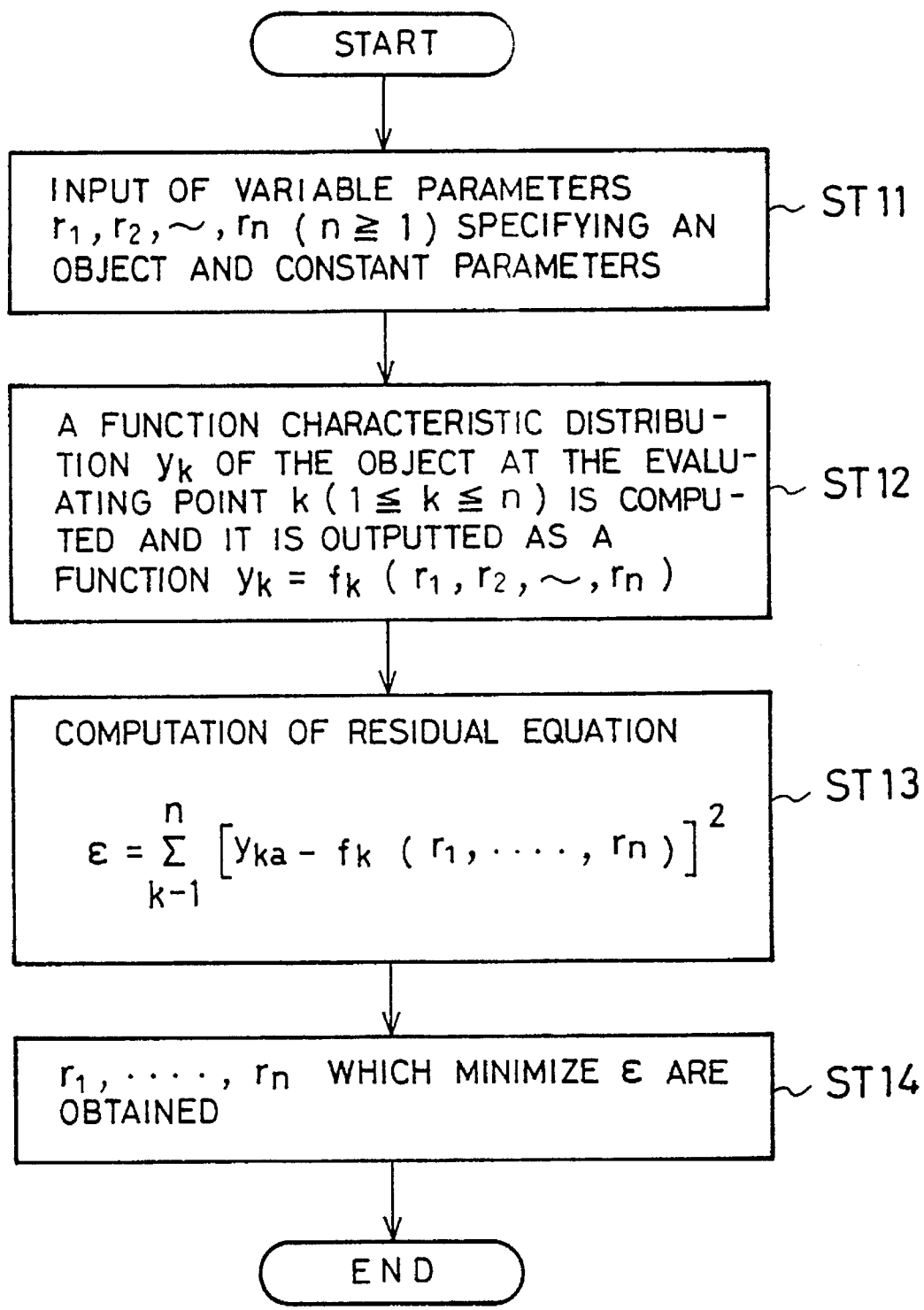
FIG. 3 is a flowchart showing a method for controlling or determining an object system according to an embodiment of the present invention.

In the step ST14 of FIG. 3, values of unknown variables $r_1, \ldots, r_n$ which minimize a value $\epsilon$ are obtained by the means 213 for minimizing the residual equation in FIG. 7. The following two kinds of methods can be used for minimizing a value $\epsilon$. The one method is an optimizing method such as the known steepest descent method. The other method is a method for solving the equation obtained by the partial differencial of $\epsilon$ with unknown variabales $r_1, \ldots, r_n$ and then equalizing or equating this equation to zero. That is, in the other method, the simultaneous equation (3) is solved.

$$\frac{\partial \epsilon}{\partial r_1} = \frac{\partial \epsilon}{\partial r_2} = \ldots = \frac{\partial \epsilon}{\partial r_n} = 0 \quad (3)$$

This simultaneous equation also has n unknown variables $r_1, \ldots, r_n$ and is composed of n equations. Therefore solutions can be obtained. Such a method has become possible because unknown variables $r_1, \ldots, r_n$ are remaining in the equation (2) in the form of variables. In the conventional system, a sum of the squares can be obtained as a numeral, the predetermined error evaluation is carried out for such numeral and the evaluation result is reflected on execution of the next boundary element method and finite element method.

Moreover, as described above, according to the conventional system, when many local minimum values exist, it is probable that the processing will be completed before the condition to give the true minimum error can be attained. However, according to the method of using the equation (3), since all maximal and minimal values can be obtained, the true minimum value can be obtained from these values.

For example, after the approximate solutions ($r_{11}, r_{12}, \ldots, r_{1n}$) can be obtained using a certain initial value, each equation in the equation (3) is divided with a product of the terms giving the approximate solutions $(r_1-r_{11}) \cdot (r_2-r_{12}) \cdot \ldots (r_n-r_{1n})$ to form equations in the lower or second approximate solution is obtained by using a new initial value for these equations. All solutions (maximal values and minimal values) can be obtained by sequentially repeating this processing.

This processing is a known processing as described, for example, in the Information Processing Handbood (OHM & Co., Ltd., 1980), p.376 and is called deflation processing. The possibility of such deflation processing is a large characteristic of the present invention. The true minimum value can easily be searched from all maximal and minimal values obtained.

For example, the region or point of $r_i$ which satisfies $(\partial \epsilon / \partial r_i) < \alpha$ ($\alpha$ is a small value, for example, 0.001) is searched by using a random number. The minimum value is searched by the steepest descent method using $r_i$ as the initial value group. Thereby, all minimal values can be obtained and the true minimum value can be found therefrom.

Figure 4:
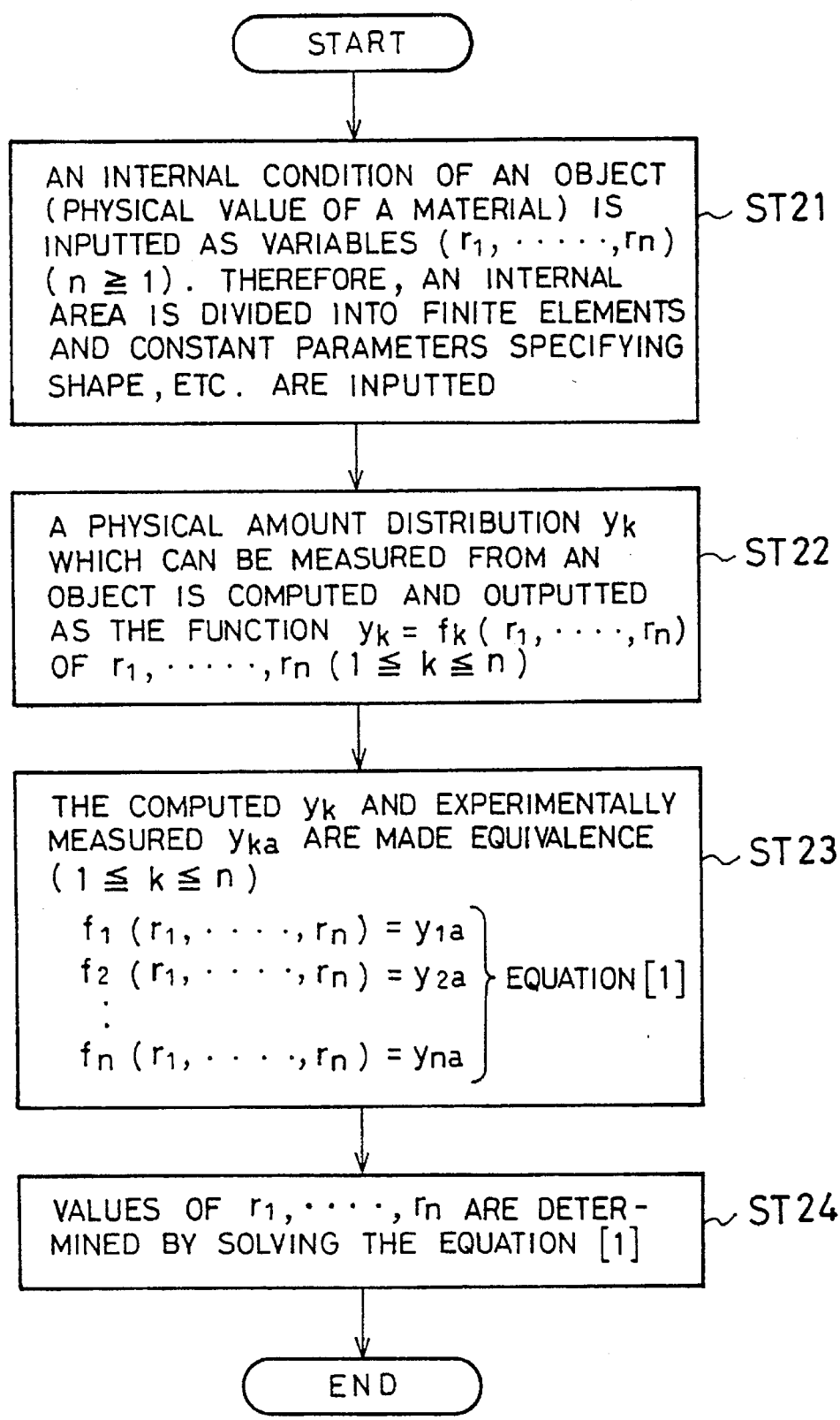
FIG. 4 is a flowchart showing a method for estimating an object system according to an embodiment of the present invention.
Figure 5:
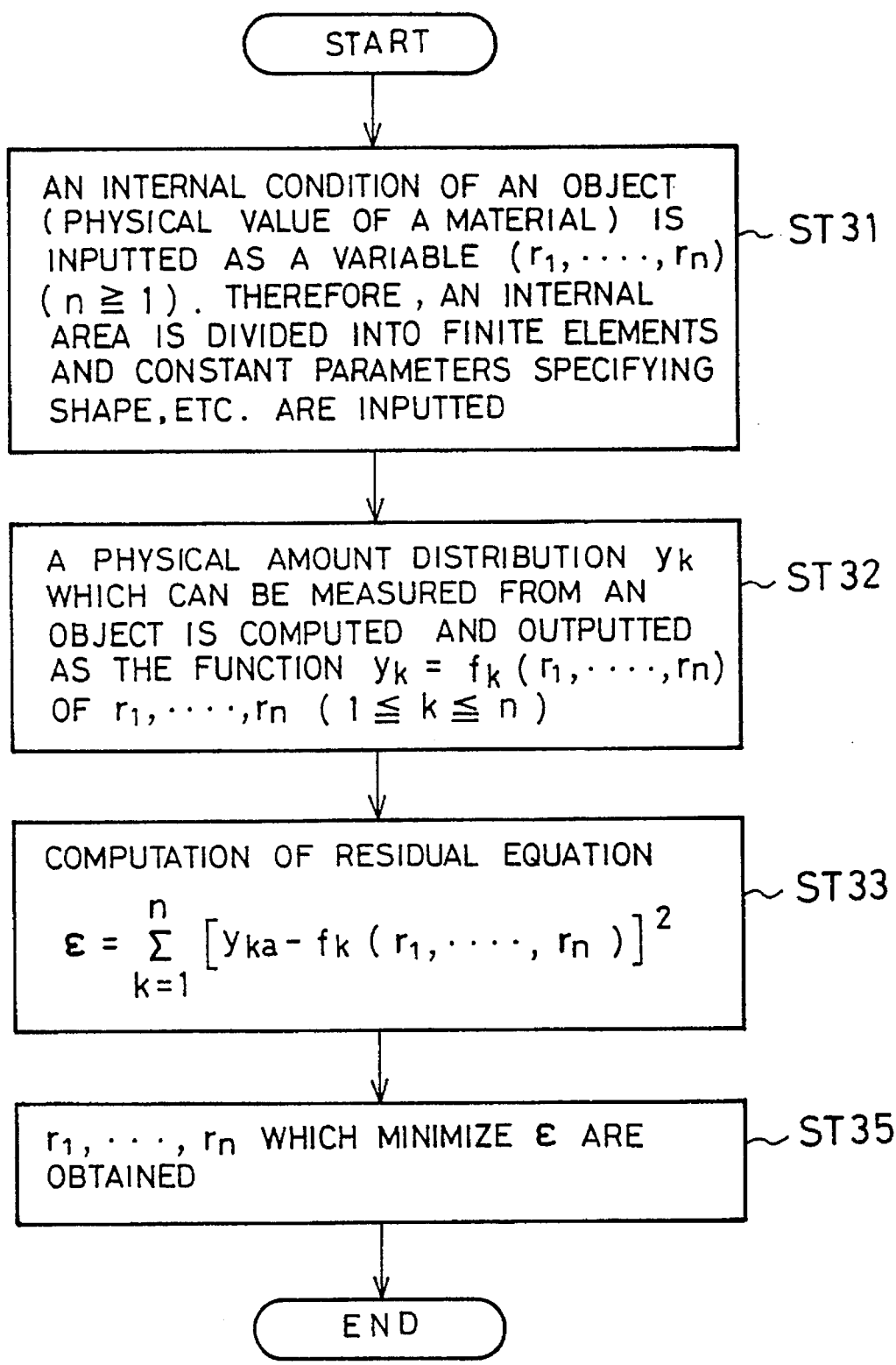
FIG. 5 is a flowchart showing a method for estimating an object system according to an embodiment of the present invention.

The methods described above are employed for designing apparatus, namely the method and apparatus for controlling or determining an object system to determine the parameters fitted to the predetermined function characteristic of an object. However, the method and apparatus for estimating an object system to estimate an internal condition of an object can also be formed in the same manner. FIG. 4 and FIG. 5 are flowcharts illustrating respective methods and FIG. 8 and FIG. 9 are block diagrams illustrating configurations of apparatus.

According to the method of FIG. 4, variable parameters corresponding to the internal condition of an object are selected by the means 221 for obtaining a function of FIG. 8 and these are considered as unknown variables $r_1, \ldots, r_n$ (step ST21). Next, a measurable physical value distribution of an object is computed as a function of the variable parameters $r_1, \ldots, r_n$ by the finite element function (step ST22). Namely, a computed value $y_k = f_k(r_1, \ldots, r_n)$ can be obtained. Next, the computed value $y_k$ and the actually measured value are equalized or equated by the means 222 for generating an equation of FIG. 8 in order to obtain the simultaneous equation designated by (1) (step ST23). When the simultaneous equation is solved by the means 223 for solving the equation of FIG. 8, the values of variable parameters corresponding to the internal conditions can be obtained (step ST24).

Moreover, according to FIG. 5, the variable parameters corresponding to the internal condition of an object are selected by the means 231 for guiding the function of FIG. 9 and these are defined as unknown variables $r_1, \ldots, r_n$ (step ST31). Next, the measurable physical value distribution of an object is computed as a function of the variable parameters $r_1, \ldots, r_n$ (step ST32). Thereafter, an equation (2) indicating a residual sum of the squares is obtained by the means 232 for generating the residual equation of FIG. 9 (step ST33) and a value of variable parameter which minimizes a value of $\epsilon$ by the means 233 for solving the residual equation of FIG. 9.

Figure 10:
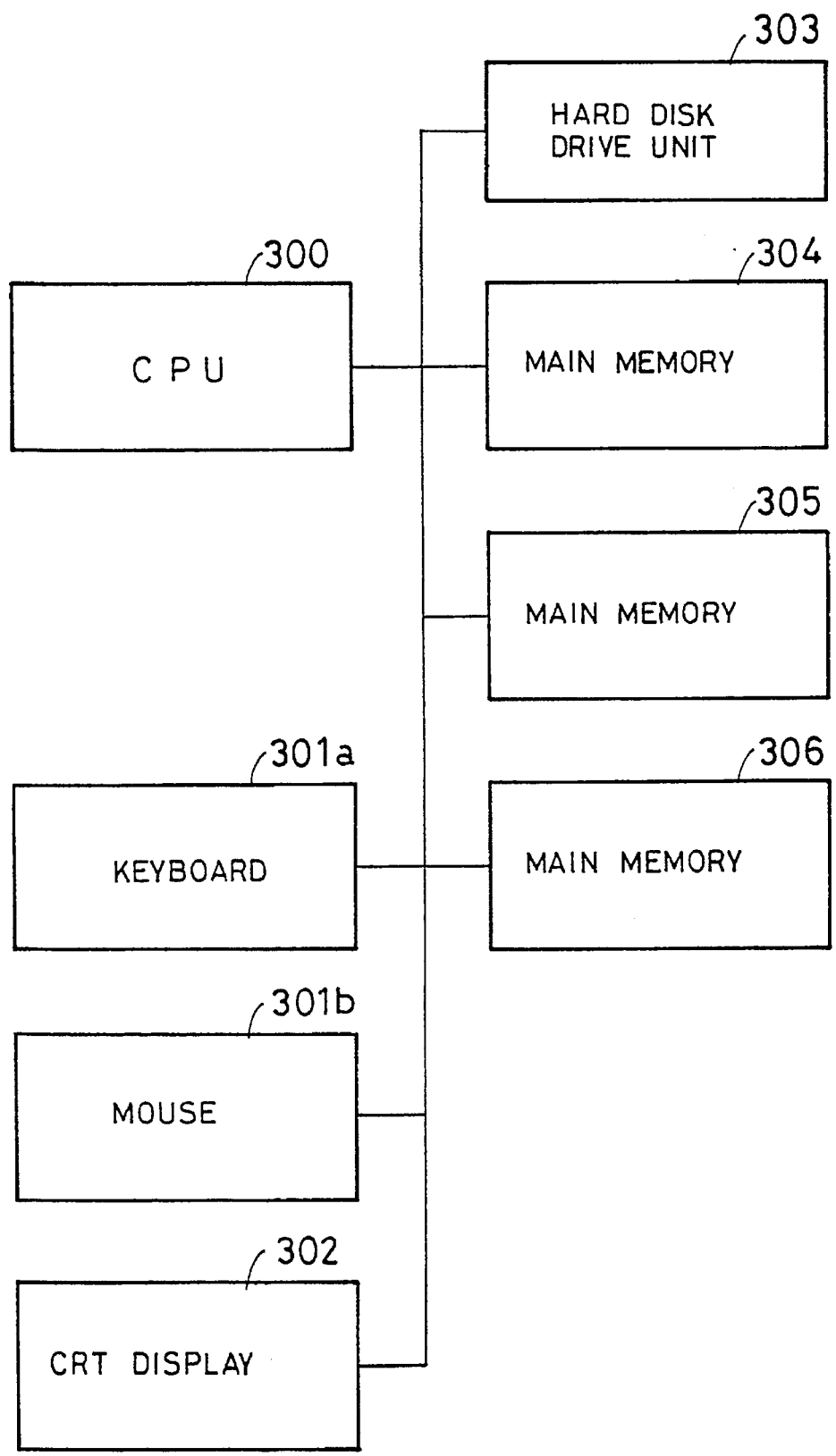
FIG. 10 is a block diagram for implementation of apparatus shown in FIGS. 6–9.

FIG. 10 shows a structural block diagram for implementing the apparatus shown in FIGS. 6–9. In FIG. 10, numeral 300 denotes a central processing unit (hereinafter referred to as a CPU) which executes a predetermined processing. Numerals 301a and 301b denote a keyboard and a mouse, respectively, with which a user inputs programs and data for CPU 300. Numeral 302 denotes a display apparatus, such as a CRT display apparatus, to display courses and results of processing of CPU 300. Numeral 303 denotes a hard disk drive unit which stores a computer language for performing symbolic computations and numerical computations. Numerals 304–306 denote main memories used for storing the programs and data in the course of processes of CPU 300.

Figure 6:
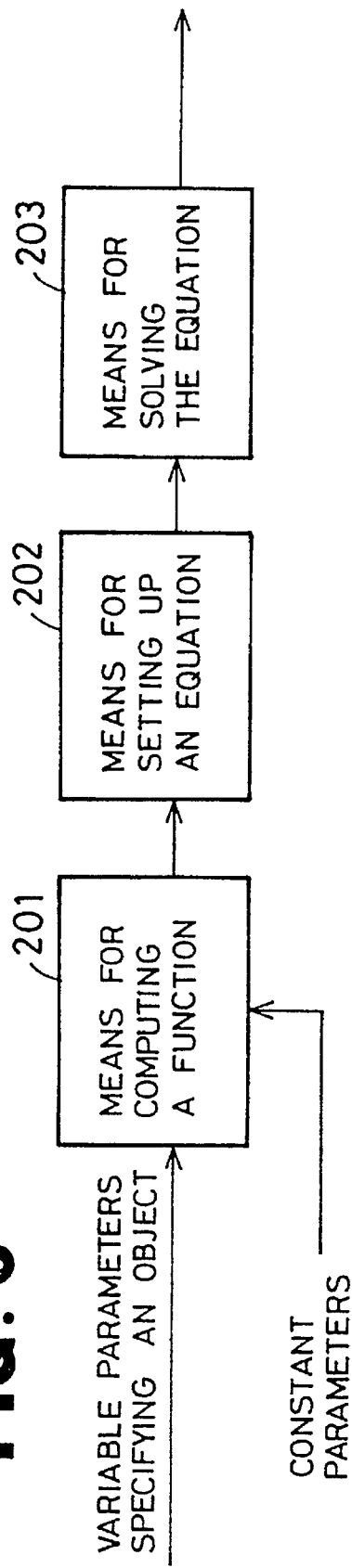
FIG. 6 is a block diagram showing an apparatus for controlling or determining an object system according to an embodiment of the present invention.

CPU 300 operates in accordance with a computer program which is input with keyboard 301a and mouse 301b. When the apparatus shown in FIG. 6 is implemented, CPU 300 loads a program corresponding to means 201 into main memory 304 and runs this program. Then, CPU 300 loads programs corresponding to means 202, means 203 into main memories 305 and 306, respectively. Then, CPU runs these programs. In executing the above-mentioned means, the computer language stored in hard disk unit 303 is used, if necessary. CPU 300 tranfers data in progress of calculation and resultant data of calculation to CRT display 302 at intervals in order to display these data.

The apparatus shown in FIGS. 7, 8 and 9 are implemented by loading programs corresponding to means 211–213, 221–223 and 231–233 and running these programs in the same manner as explained above.

Values obtained as described above are estimated values of physical amount of respective elements and the internal condition of an object can be estimated on the basis of these values.

Embodiment 1:

FIG. 11 shows a one-dimensional transmission line problem described in the Finite Elements for Electrical Engineers, 2nd Edition, Cambridge University Press, 1990, p1 to p19. This example will be explained hereunder.

Figure 11A:
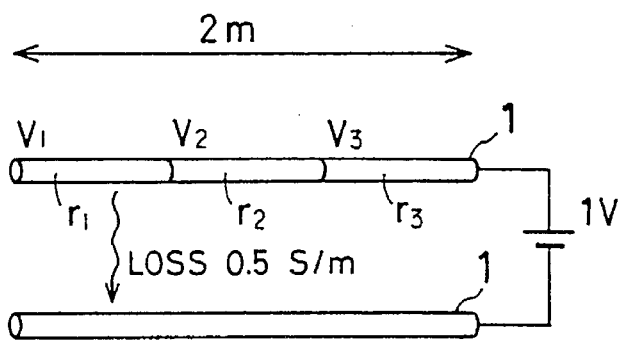
FIGS. 11(a) and 11(b) are explanatory views showing a problem of one-dimensional transmission line.
Figure 11B:
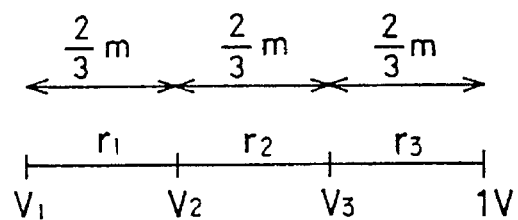

FIG. 11(a) shows the condition that a transmission line 1 (for example, two lines of bare copper leads arranged in parallel) of 2 m long is arranged in the medium resulting in electrical loss (for example, under the ground with loss of 0.5 s/m). To an end of transmission line 1, a voltage of 1V is applied and the other end is in an open condition. Here, it is considered to obtain the material characteristic of the transmission line 1 which brings the node voltage on the transmission line 1 to desired values. In this case, the transmission line 1 is divided, as shown in FIG. 11(b), into three sections in the length direction for finite element analysis of three elements.

The above reference shows an example where parameters such as size and resistivity of transmission line 1 and conductivity of medium which specify the transmission line are given as numerical values and the node voltages $V_1$, $V_2$, $V_3$ at both ends of three elements are obtained by the finite element method. However, in this embodiment, it is considered to obtain the material characteristic of the transmission line 1 for setting the node voltages $V_1$, $V_2$, $V_3$ to the predetermined values.

Resistivities of elements are respectively expressed by such codes as $r_1$, $r_2$, $r_3$. Other parameters, for example, length of each element and conductivity of medium are expressed by numerical values. The node voltages $V_1$, $V_2$, $V_3$ can be computed by the finite element method. Here, as shown in the equation (5), the computation result is expressed as a function of the resistivities $r_1$, $r_2$, $r_3$ of respective elements.

$$V_1 = (9r_1 - 0.333333r_1^2 - 0.333333r_1r_3 + \quad (5)$$
$$0.0123457r_1^2r_3) \cdot (3r_3 - 0.111111r_2r_3)/(-27r_1r_3 -$$
$$2r_1^2r_3 - 14r_1r_2r_3 - 0.703704r_1^2r_2r_3 - 8r_1r_3^2 -$$
$$0.259259r_1^2r_3^2 - 1.14815r_1r_2r_3^2 - 0.0356653r_1^2r_2r_3^2)$$

$$V_2 = (9r_1 + 0.666667r_1^2 - 0.333333r_1r_3 -$$
$$0.0246914r_1^2r_3) \cdot (3r_3 - 0.111111r_2r_3)/(-27r_1r_3 -$$
$$2r_1^2r_3 - 14r_1r_2r_3 - 0.703704r_1^2r_2r_3 - 8r_1r_3^2 -$$
$$0.259259r_1^2r_3^2 - 1.14815r_1r_2r_3^2 - 0.0356653r_1^2r_2r_3^2)$$

$$V_3 = (9r_1 + 0.666667r_1^2 - 2.66667r_1r_3 +$$
$$0.0864198r_1^2r_3) \cdot (3r_3 - 0.111111r_2r_3)/(-27r_1r_3 -$$
$$2r_1^2r_3 - 14r_1r_2r_3 - 0.703704r_1^2r_2r_3 - 8r_1r_3^2 -$$
$$0.259259r_1^2r_3^2 - 1.14815r_1r_2r_3^2 - 0.0356653r_1^2r_2r_3^2)$$

At the time of obtaining the equation (5), in concrete, the coding is conducted using the Mathematica language which can execute symbolic computation and such symbolic computation has been conducted by a computer. In addition, since FORTRAN does not have the function for symbolic computation, it cannot be used.

For example, when $V_1$=0.2V, $V_2$=0.4V, $V_3$=0.9V are selected as the predetermined values, it is enough to solve the three-element simultaneous equation which can be obtained by substituting these values to the equation (5). Therefore, this embodiment is an example of the processing based on the flowchart of FIG. 2. In this case, an equation is non-linear and can be solved using the well known Newton method. When the Newton method prepared by the Mathematica language is employed, the following solutions can be obtained within about two seconds (in the case of using a Macintosh made by Apple Computer).

$r_1$=6.75Ω/m $r_2$=0.317647Ω/m $r_3$=3.85714Ω/m

As explained above, the parameters for realizing predetermined voltage voltages can be determined easily. Namely, the material characteristic distribution can be obtained immediately by giving the design target values.

Here, the number of elements is set to 3 using the one-dimensional model for the convenience of explanation, but it is also possible to raise the accuracy by increasing the number of elements. Moreover, the method of the embodiment can also be applied to bidimensional and three dimensional models, which is also applicable to the following embodiments. To summarize, the present invention provides a means for designing an object having the function to determine complicated material characteristic distribution for desired objects to realize the predetermined function distribution characteristic.

Embodiment 2:

In the first embodiment, the node potentials $V_1$, $V_2$, $V_3$ in the equation (5) obtained by the finite element method are equalized to the predetermined values to determine the resistivities $r_1$, $r_2$, $r_3$. In this embodiment, however, the values of $r_1$, $r_2$, $r_3$ which minimize the sum of the squares are obtained. Therefore, this embodiment is an example of the processing indicated by the flowchart of FIG. 3. The residual sum of the squares of the node voltages $V_1$, $V_1$, $V_3$ and the predetermined values is expressed by the following equation (6).

$$\epsilon = (V_1 - 0.2)^2 + (V_2 - 0.4)^2 + (V_3 - 0.9)^2 \quad (6)$$

The node potentials $V_1$, $V_2$, $V_3$ of FIG. 5 are substituted into the equation (6) to obtain the values of resistivities $r_1$, $r_2$, $r_3$ which minimize the value of $\epsilon$. For example, the minimum value of $\epsilon$ can be determined by the well known steepest descent method (a method for dropping the value in the steepest gradient direction of a function to search the valley of the function showing the minimum value). By the steepest descent method, following values are obtained as the values of resistivities $r_1$, $r_2$, $r_3$.

$r_1$=6.78157Ω/m $r_2$=0.317731Ω/m $r_3$=3.85387Ω/m

Moreover, as is already described, a method is also proposed to obtain the minimum value of $\epsilon$ that the equation (6) is respectively partially differentiated by $r_1$, $r_2$, $r_3$ and the equations obtained are equalized or equated to zero to form the equations. In this case, the following equation (7) can be obtained.

$$\frac{\partial \epsilon}{\partial r_1} = \frac{\partial \epsilon}{\partial r_2} = \frac{\partial \epsilon}{\partial r_3} = 0 \quad (7)$$

Namely, a three-element simultaneous equation can be obtained by substituting the node potentials $V_1$, $V_2$, $V_3$ expressed by the equation (5) into the equation (6) and applying the equation (7) to the obtained equation. This equation is non-linear and can be solved by the Newton method. Namely, following solutions can be obtained by solving the equation with the Newton method prepared by the Mathematica language setting the voltages, $V_1$=0.255984V, $V_2$=0.31742V, $V_3$=0.531V as the predetermined values.

$r_1 = 2.0 \Omega/m$ $r_2 = 2.00127 \Omega/m$ $r_3 = 1.99811 \Omega/m$

Figure 12:
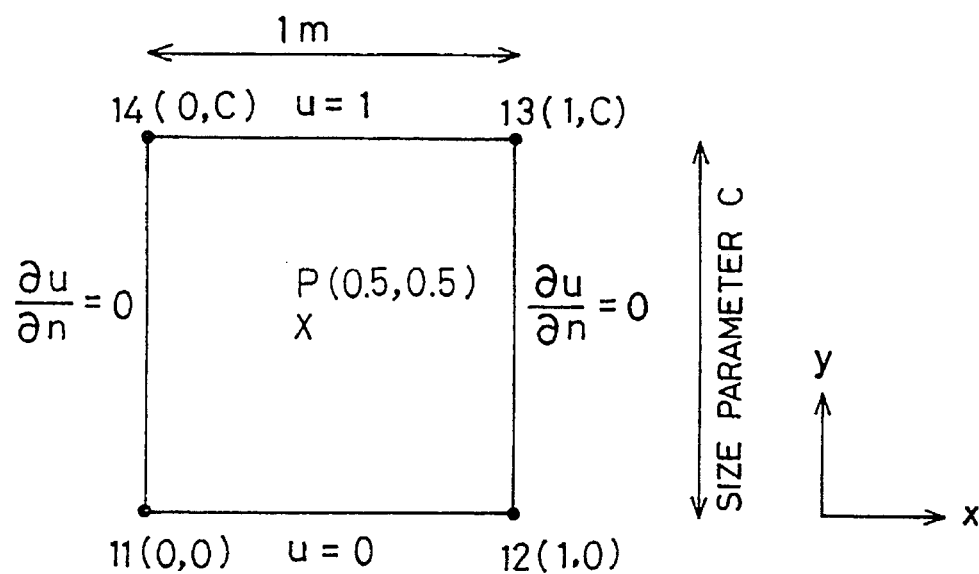
FIG. 12 is an explanatory view showing a problem of boundary value in a rectangular region expressing an event with a Laplace's differential equation.

Embodiment 3:

FIG. 12 illustrates an example of a boundary value problem in a rectangular region in which an event is expressed by a Laplace's equation. Namely, it is considered here that a size c is determined to set a potential at the point P to the predetermined value. Moreover, the length of the other one side is set to 1 m. As the boundary condition, the potentials of two sides provided opposed to each other are given as u=1, u=0 and the rate of change of 0 of the potential in the tangent direction for the boundary line (the equal level line of potential is perpendicular to the boundary line) is given for the other two sides. The numerals 11 to 14 indicate the nodes and values within the parentheses in the vicinity of nodes means the coordinates values.

Figure 13:
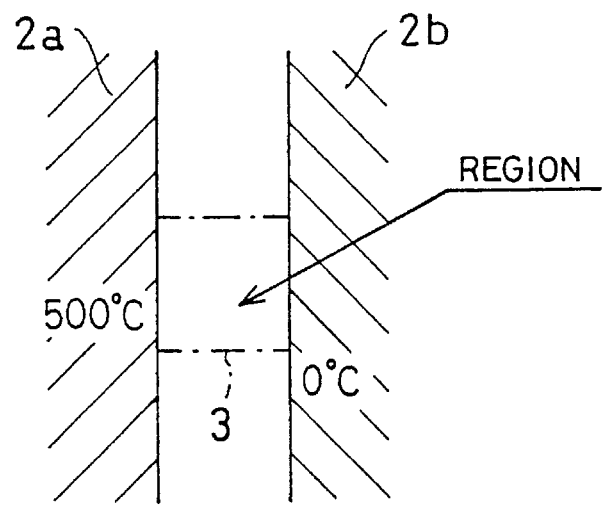
FIG. 13 is an explanatory view showing a model of heat conduction problem.

A heat conduction problem shown in FIG. 13 is a practical example corresponding to the problem shown in FIG. 12. This example is described, for example, in the Boundary Element Analysis by Microcomputer (published by Baihukan, 1986), p63. In the case of this problem, two sheets of walls 2a, 2b, having different temperatures, provided in parallel with each other are considered (for example, external surface temperature of the left wall is set to 500° C. and external surface temperature of the right wall to 0° C.) to discuss temperature potential of the space (region (3)) between these walls.

Figure 14:
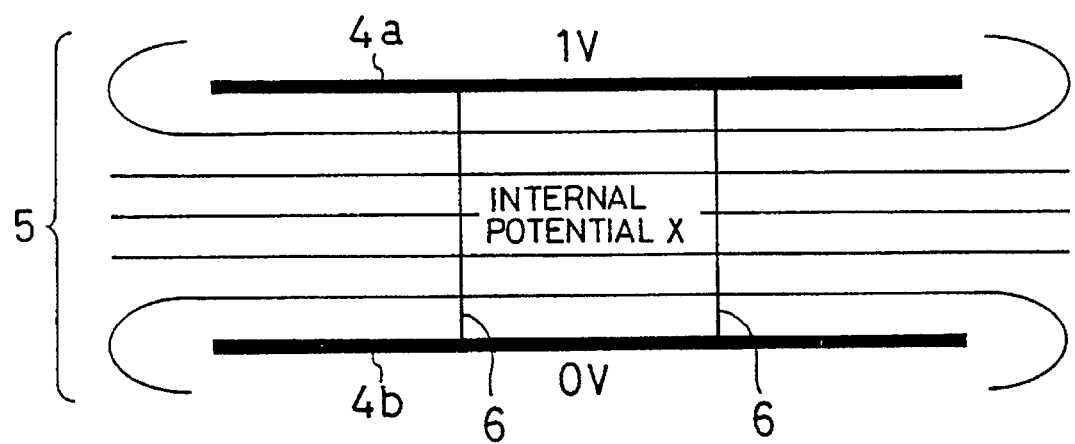
FIG. 14 is an explanatory view showing a model of a problem for obtaining internal potential between parallel flat electrodes.

As the other example, there lies a problem for obtaining internal potential when a voltage is applied across the parallel flat electrodes 4a, 4b as shown in FIG. 14. In the vicinity of the center of parallel flat electrodes 4a, 4b, the equal potential line becomes parallel to the parallel flat electrodes 4a, 4b. Therefore, if a virtual boundary 6 is provided, this problem can be indicated by a model as shown in FIG. 12.

Figure 2:
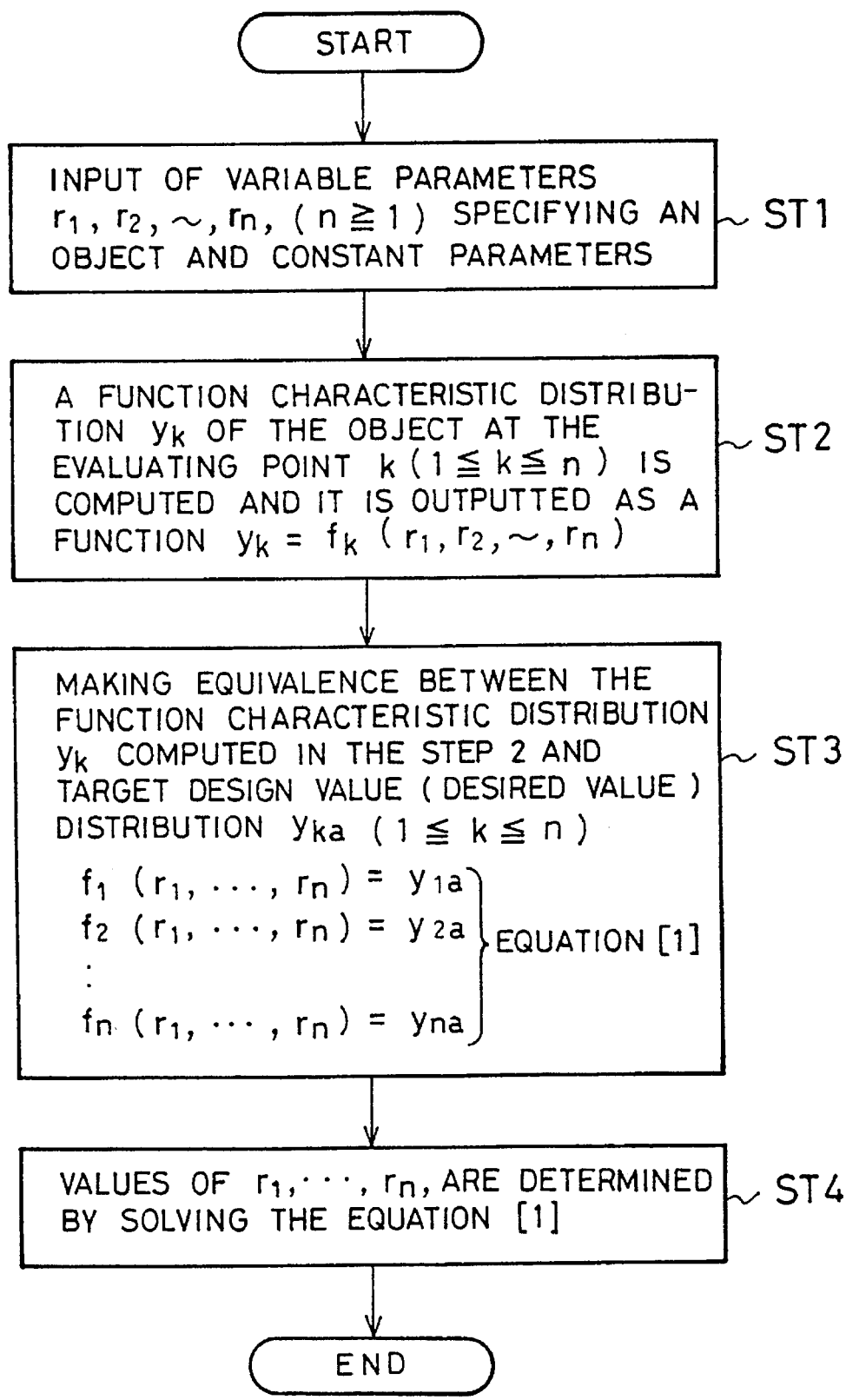
FIG. 2 is a flowchart showing a method for controlling or determining an object system according to an embodiment of the present invention.

Here, it is considered to determine the size c which sets the potential at the point P in FIG. 12 to the predetermined value with the processing based on the flowchart of FIG. 2. In this case, a variable parameter is the size c. The potential of point P is obtained using the boundary element method. With the analysis by the boundary element method, the potential of point P is given as a function of the size c.

For example, when the potential of point P is set to 0.5, an equation is set by equalizing the function of size c to 0.5. The solution of this equation is c=0.998469.

Figure 15:
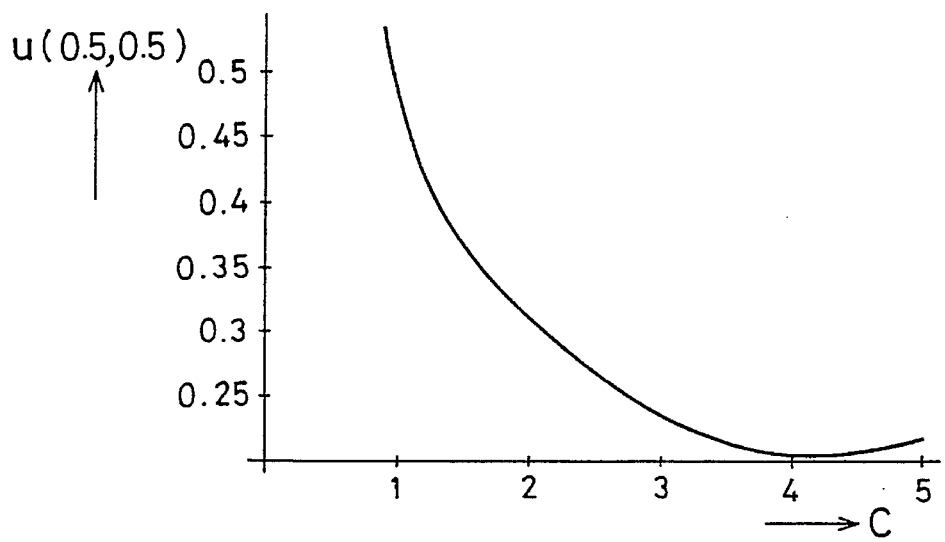
FIG. 15 is a characteristic diagram showing characteristic of potential for size.

Since the potential of point P is given as a function of the size c, the characteristic diagram of the potential (u(0.5, 0.5)) of the potential P vs. size c as shown in FIG. 15 can easily be obtained. In the conventional method by numerical calculation, the potential of the point P has been obtained by the boundary element method, based on the precondition that the size c is given as the practical numerical value. The potential of point P is obtained again with the boundary element method by changing a value of size c. The characteristic of FIG. 15 has been obtained by repeating such processings.

Particularly, when this characteristic changes in a complicated manner, it is very difficult to select the step of the value to the adequate value on the occasion of determining various values of the size c. However, according to this embodiment, the characteristic can easily be obtained since the potential of point P can be expressed as a function of size c. Moreover, differential coefficients can also be obtained by the analytic differential of the function and a profile for change of potential can be detected accurately.

Embodiment 4:

FIG. 16 shows a disk type conductor model. This model is described, for example, in the Modern Electrical Finite Element Metehod (OHM & CO., LTD), p5. As shown in FIG. 16(a), voltages of +100V and −100V are respectively applied to two points. The model shown in FIG. 16(a) has symmetry and only the first quadrant can be considered as the object for analysis. Therefore, as shown in FIG. 16(b), only the first quadrant is considered as the analysis object and such part is divided into seven elements.

The coordinates of the nodes 21~28 are as shown in FIG. 16(c). Namely, the x coordinate of node 22 is defined here as the variable parameter d. It is thought to determine a value d which sets the voltage of node 23 to the predetermined value using the method based on the flowchart of FIG. 2 (namely, it is determined in such a degree, a disk shape is deformed).

Figure 17:
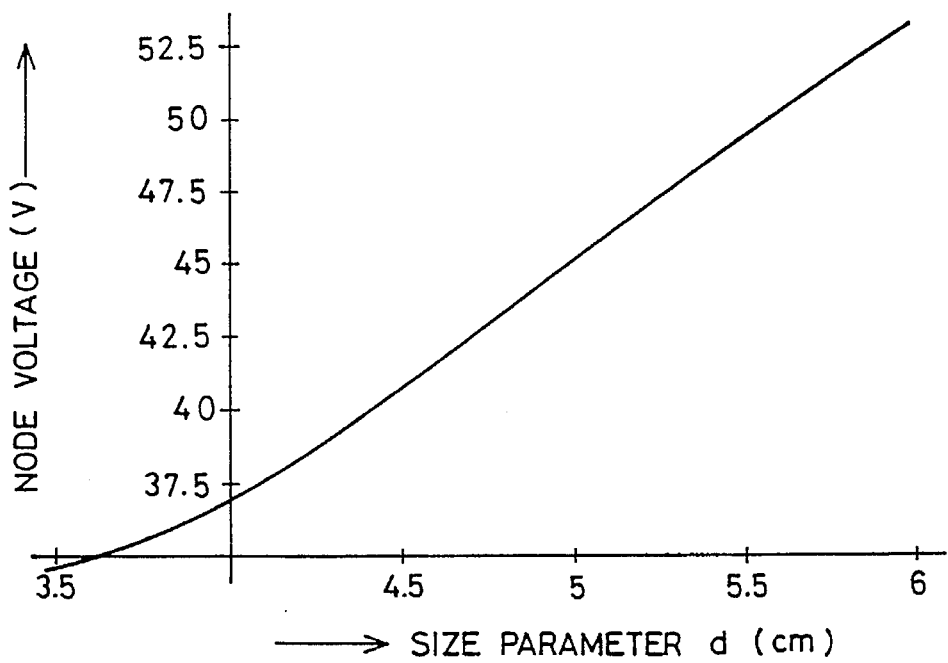
FIG. 17 is a characteristic diagram showing characteristic of node potential for size.

A potential of the node 23 is expressed as a function of variable parameter d by the finite element method. Moreover, the desired voltage of the node 23 is preset to 40.767V. An equation is formed by equalizing the function to 40.767V. The result, d=4.5 cm can be obtained by solving the equation. In addition, since a voltage of node 23 is expressed as a function of the variable parameter d, the characteristic shown in FIG. 17 can be obtained easily.

Embodiment 5:

In the model shown in FIG. 16(b), it is considered here to obtain a value of variable parameter d, which sets the voltage of node 23 and the voltage of node 24 to the predetermined value, with the method based on the flowchart of FIG. 3. By the finite element method, the voltage $V_3$ of node 23 and the voltage $V_4$ of node 24 are given as the functions of the variable parameter d. Moreover, the desired voltage of node 23 is set to 40.7V and that of node 24 to 27.3V. Thereby, the residual sum of the squares is given by the following equation (8).

$$\epsilon = (V_3 - 40.7)^2 + (V_4 - 27.3)^2 \tag{8}$$

Figure 18A:
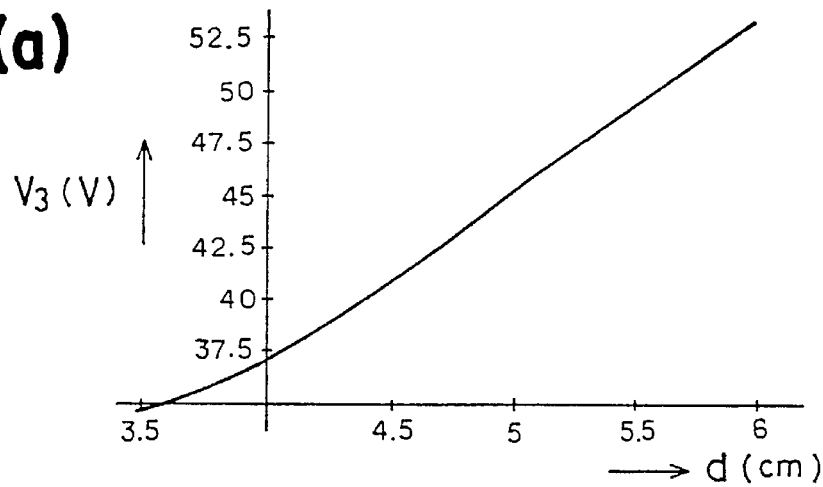
FIGS. 18(a), 18(b) and 18(c) are characteristic diagrams showing characteristic of node potential and residual square sum for size.
Figure 18B:
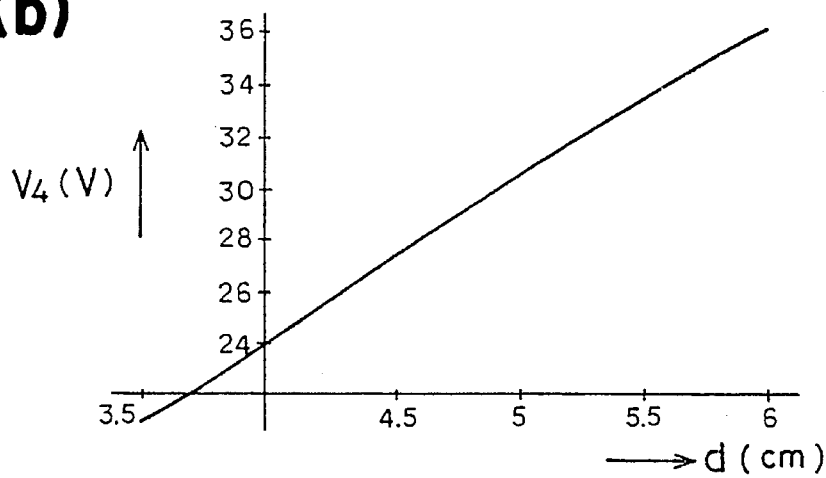
Figure 18C:
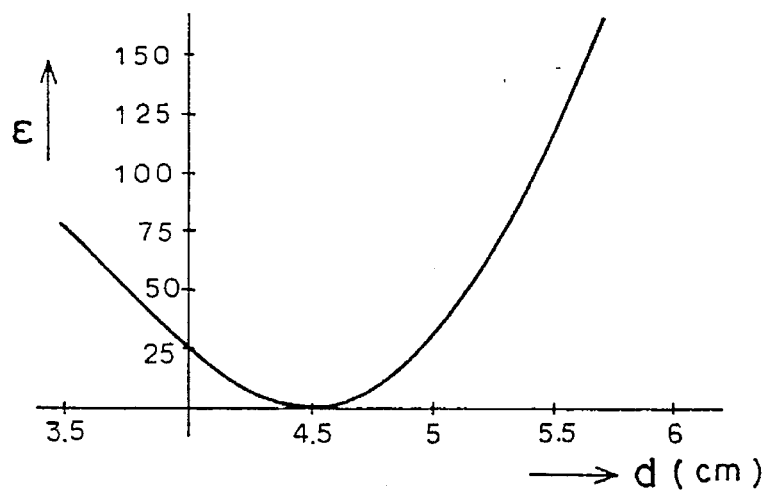

As a value of d which minimizes $\epsilon$, d=4.49345 can be obtained. Moreover, the same result can also be obtained by solving the equation formed by equalizing or equating the elements obtained by differentiating the equation (8) with d to zero. FIG. 18 shows the characteristic of $V_3$, $V_4$ and $\epsilon$ for the variable parameter d. Since $V_3$, $V_4$ and $\epsilon$ are expressed as the function of d, each characteristic can be obtained easily.

Above embodiments are related with electrical fields but the present invention can also be applied to the field of fluid engineering. FIG. 19 shows an example of analysis for air flow around an automobile described in "What Every Engineering Should Know About Finite Element Analysis, p.192, Marcel Dekker, 1988".

Figure 19A:
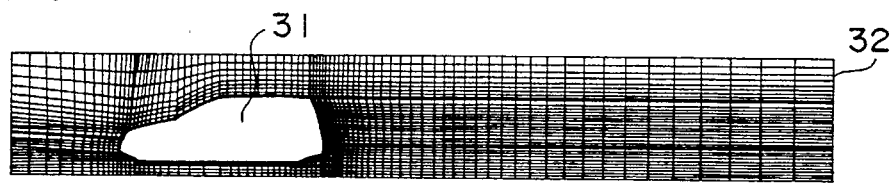
FIGS. 19(a), 19(b), 19(c) and 19(d) are explanatory views showing an example of analysis of air flow in the periphery of an automobile.
Figure 19B:
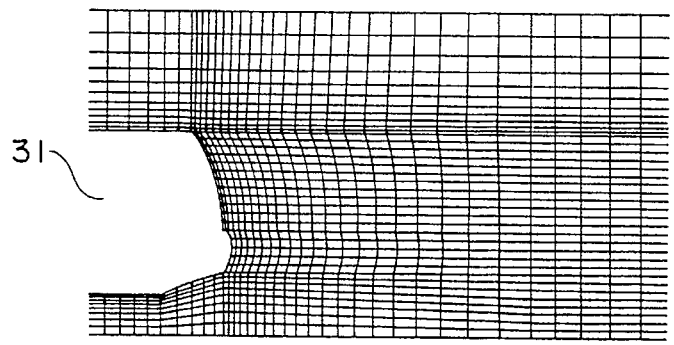
Figure 19C:
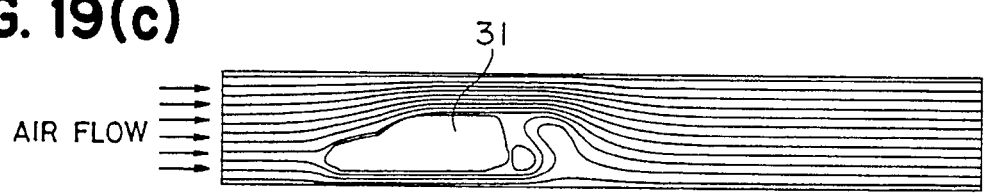
Figure 19D:
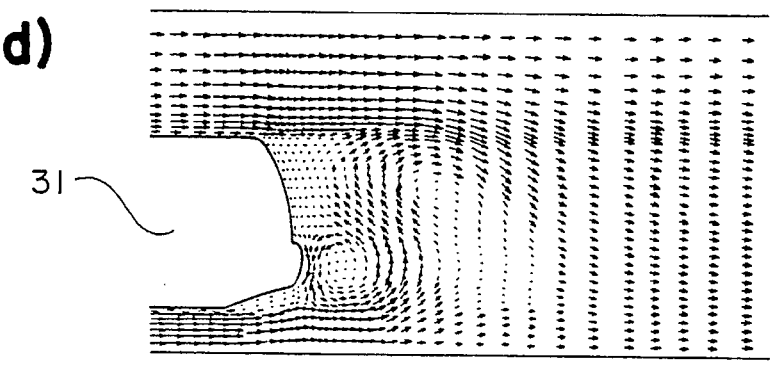

In this figure, numeral 31 denotes a car and 32, ambient air. Each meshed area of FIG. 19(b) is each divided element. FIG. 19(c) shows air flow. FIG. 19(d) shows a velocity vector distribution diagram. According to the present invention, element division is carried out as shown in FIG. 15(b) and an equation is set using the finite element method defining the shape of automobile 31 as a variable parameter. Moreover, an external shape of automobile 31 which minimizes influence on the air flow can be designed by making an analysis of such equation.

The present invention can also be applied to the field of machine engineering. FIG. 20 shows an example of analysis for stress distribution within a metal material generated at the time of threading of a hollow metal shaft described in "The Finite Element Method, 4th edition, McGraw-Hill, 1989", p269.

Figure 20A:
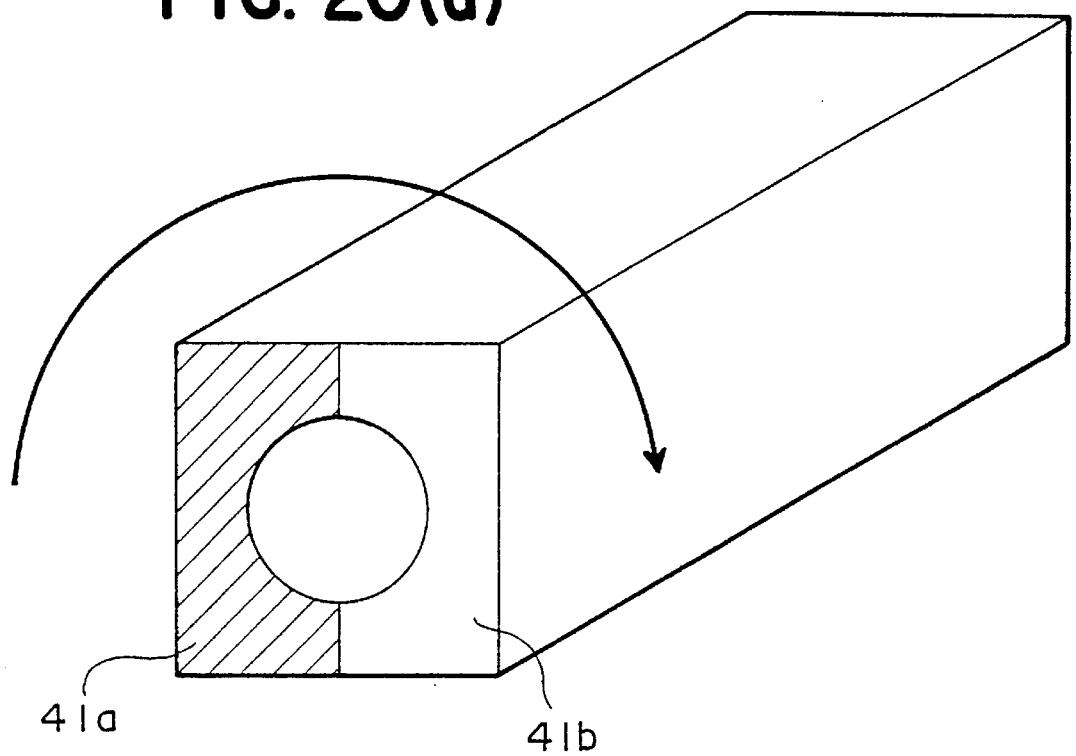
FIGS. 20(a) and 20(b) are explanatory views showing an example of analysis of stress distribution within a hollow metal shaft.
Figure 20B:
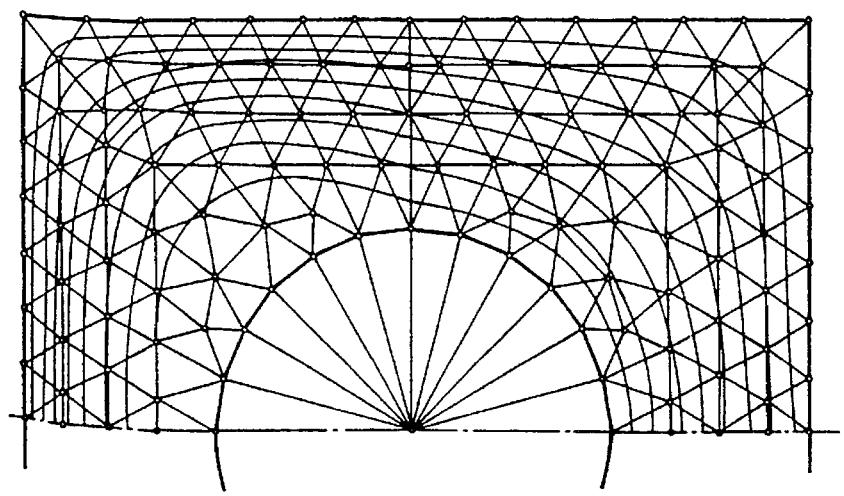

In FIG. 20, 41a, 41b are respectively different metal materials. FIG. 20(a) is a perspective view of a hollow metal shaft and FIG. 20(b) shows each element set within the hollow metal shaft. The above reference shows stress values at the nodes. According to the present invention, an equation is set using the finite element method by executing element division as shown in FIG. 20(b) and defining shape of hollow metal shaft and physical values of metal materials 41a, 41b as variable parameters and moreover such equation is analyzed. Thereby, shape of shaft and physical values of material which do not result in concentration of stress at the inside can be designed.

Figure 21:
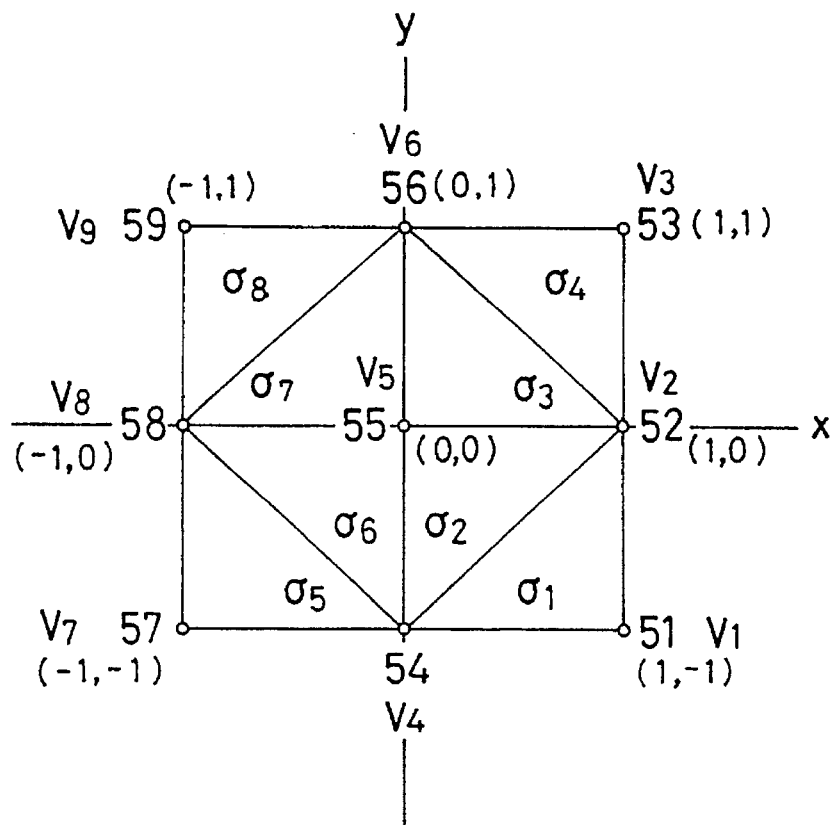
FIG. 21 is an explanatory view for explaining a method of estimating internal conductivity of a conductor model of square shape.

Embodiment 6:

An embodiment of the method for estimating an internal condition of an object from the measured values of such object will be explained. Here, an impedance CT problem will be explained using a square conductor model shown in FIG. 21. As shown in FIG. 21, the internal side of conductor is divided into eight elements. In FIG. 21, 51~59 are nodes and the numerals within the parentheses in the vicinity of the nodes indicate coordinates.

In this case, a voltage is externally applied to the square conductor having an unknown conductivity distribution and a voltage distribution at the surface of conductor is measured. The conductivity distribution is estimated from the measured values using the method based on the flowchart of FIG. 5. Voltages of the nodes 51~59 are defined as $V_1, \ldots, V_9$ and conductivities of the elements as $\sigma_1, \ldots, \sigma_8$. Moreover, each side of a square is set to 2 m.

Voltages of other six nodes can be measured by applying voltages to two points of eight nodes 51~54, 56~59 on the surface of the conductor. An equation expressing six nodes as the functions of $\sigma_1, \ldots, \sigma_8$ can be obtained using the finite element method. Namely, conductivities $\sigma_1, \ldots, \sigma_8$ are variable parameters. A residual sum of the squares is generated using these equations and actually measured values of voltages of the nodes and then the values of conductivities $\sigma_1, \ldots, \sigma_8$ which minimize such sum of the squares is obtained to give the estimated values of conductivities.

For instance, it is considered here that 1V is applied to the node 52 and 0V to the node 58. In this case, conductivies $\sigma_4, \ldots, \sigma_8$ among $\sigma_1, \ldots, \sigma_8$ are given the known values in order to simplify the calculation. Moreover, measured voltage values are generated by simulation. That is, the node voltages are obtained by the ordinary finite element method (conventional method) when $\sigma_1 = 0.1$ s/m and $\sigma_2, \ldots, \sigma_8$ are 1.0 s/m and these node voltages are used as the measured voltage values.

In this case, the equations indicating node voltages using three conductivities $\sigma_1$~$\sigma_3$ can be obtained. Here, the residual sum of the squares of the node voltages indicated by these equations and the measured voltages is obtained. Since this square sum includes $\sigma_1$~$\sigma_3$ as unknown variables, the values of $\sigma_1$~$\sigma_3$ which minimizes the square sum thereof are obtained. Thereby, the following values can be obtained.

$\sigma_1 = 0.0927542$ S/m $\sigma_2 = 1.03182$ S/m $\sigma_3 = 0.971097$ S/m

This embodiment explains, using the method based on the flowchart of FIG. 5, a method of minimizing the residual sum of the squares. Here, the method based on the flowchart of FIG. 4 can also be used. However, it is probable that a measuring error (noise, for example) may be included in the measured values because the measured values (actually measured values) of an object are used. Therefore, if the possibility of inclusion of measuring error cannot be neglected, it is better to use the method based on the flowchart of FIG. 5 rather than the method based on the flowchart of FIG. 4 in which the obtained function is equalized or equated to the measured value. It can be understood from the fact that a method of searching the characteristic using the minimum sum of the squares is often employed for processing the measured data.

Explanation about FIG. 21 refers to an estimation of an internal condition using the measured data, but it can also be applied in generally to acquisition of an internal image such as a tomographic image represented by X-ray CT and electrical impedance CT and diagnosis of the structure. Moreover, the present invention can also be applied to diagnosis for deterioration and non-destructive inspection of cooling pipes of atomic furnace and various structures. The present invention can also be applied for control of an internal condition (namely, conductivity distribution, in this case) in order to approximate the surface potential in FIG. 21 to a certain control target.

Figure 22:
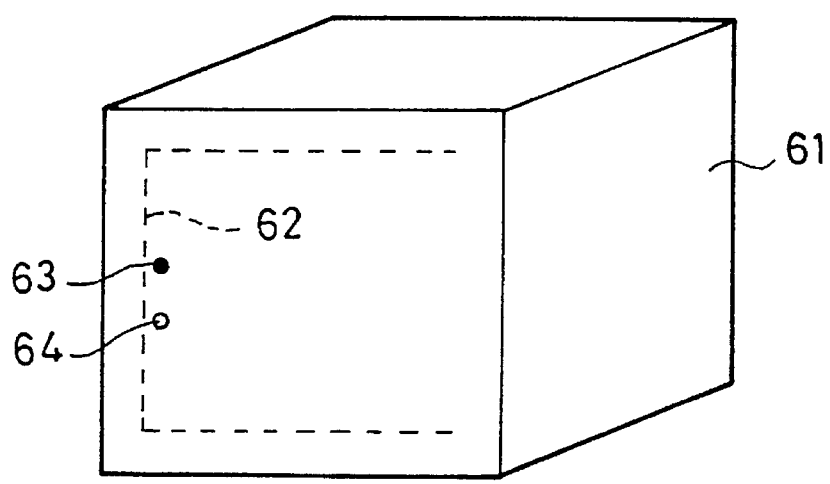
FIG. 22 is a conceptional view showing an example in which a method and an apparatus for controlling or determining and estimating an object system according to the present invention is applied for estimation and control of temperature distribution within a reaction furnace.

In summary, the present invention relates to a method and an apparatus for controlling or determining and estimating an object system. As the complementary explanation about control of the object system, for example, control of a plant utilizing a chemical reaction can also be considered. For instance, in this case, estimation and control of internal temperature distribution by measuring temperature of the reaction furnace wall and internal pressure can be performed. FIG. 22 is a conceptional view illustrating such application example. In this figure, numeral 61 denotes a reaction furnace; 62, internal wall thereof; 63, a temperature sensor provided at the internal wall 62; 64, a pressure sensor provided within the reaction furnace 61. In concrete terms, it is enough to conduct the calculation of the reaction furnace system using the finite element method and boundary element method which are already explained.

Figure 23:
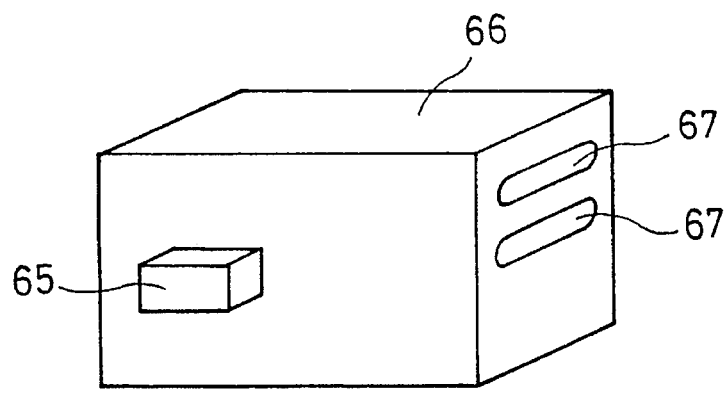
FIG. 23 is a conceptional view showing an example in which a method and an apparatus for controlling or determining and estimating an object system according to the present invention is applied for design of an electromagnetic noise shielding body.

Next, as the complimentary explanation about determination of the object system, for example, the optimum design of a variety of electromagnetic apparatus including an electromagnet system can be considered. In this case, the optimum shape of magnet can be designed by giving magnetic field distribution generated by an electromagnet. Moreover, the present invention can be applied to design of a method and an apparatus for shielding electromagnetic noise which is recently discussed frequently. FIG. 23 is a conceptional view illustrating such an application example. In this figure, numeral 65 denotes an electromagnetic noise source; 66, a shielding body arranged to surround the ambience of the electromagnetic noise source 65; 67, cooling holes bored on the shielding body 66. In this case, a current distribution of the electromagnetic noise source 65 is estimated by measuring, for example, the intensity distribution of noise generated and the structure of the shielding body is decided based on such estimation. For instance, the structure of the shielding body 66, namely where the cooling holes 67 should be bored thereon can be determined.

Figure 24:
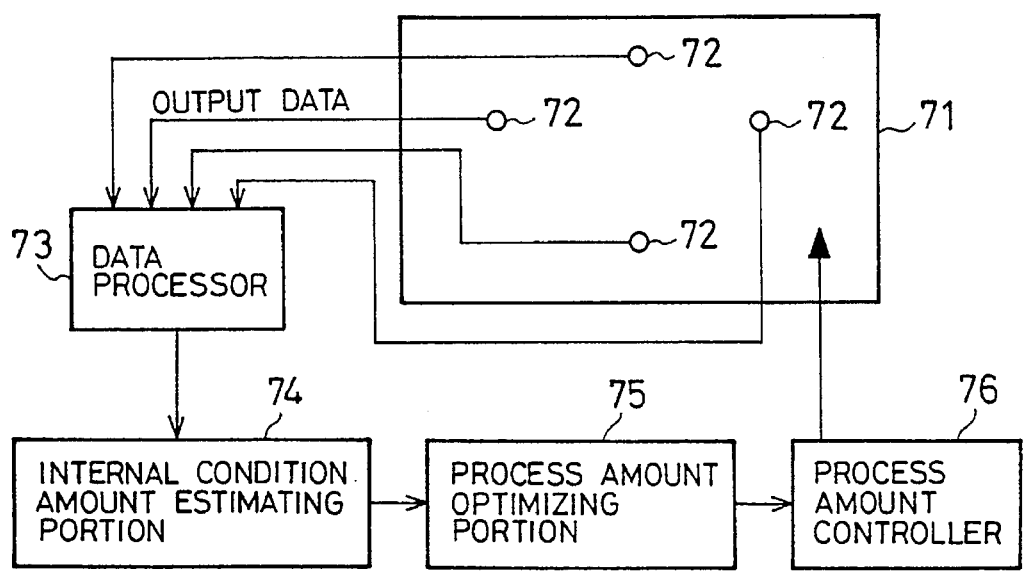
FIG. 24 is a block diagram showing a configuration of a process apparatus generally employing each application example.

The application examples shown in FIG. 22 and FIG. 23 can generally be thought of as the control or determination of the process apparatus shown in FIG. 24. In this figure, the numeral 71 denotes a process apparatus; 72, a sensor provided at the predetermined point of the process apparatus 71; 73, a data processor for processing output data of the sensor 72; 74, an internal condition amount estimating portion for estimating internal condition amount of the process apparatus 71 on the basis of the processing result of the data processor 73; 75, a process amount optimizing portion for optimizing process amount depending on the estimated internal condition amount; 76, a process amount controller for controlling process amount of the process apparatus 71 depending on an output of the process amount optimizing portion 75.

Figure 25:
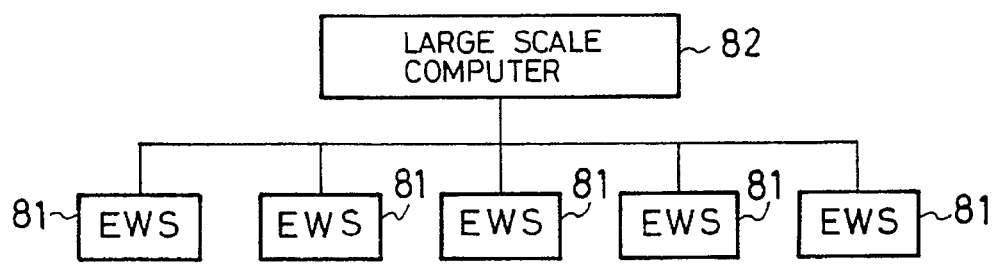
FIG. 25 is a block diagram showing a computer system for realizing an apparatus for controlling or determining and estimating an object system according to the present invention.

In addition, an apparatus for realizing the method of the present invention can be achieved by realizing respective means shown in FIG. 6–FIG. 9 by connecting, for example, a plurality of engineering workstations (EWS) to a computer network and then executing the programs stored in the memory thereof. Moreover, as shown in FIG. 26, a highly efficient application of a computer can be realized by forming a network through hierarchical structure of a plurality of EWS 81 and a large scale computer system (FIG. 25).

Figure 26A:
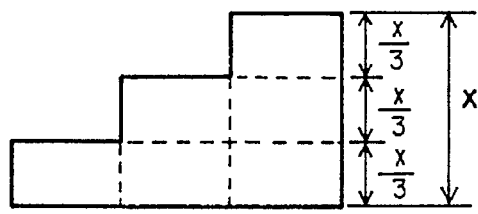
FIGS. 26(a) and 26(b) are explanatory views for explaining preference of the present invention.
Figure 26B:
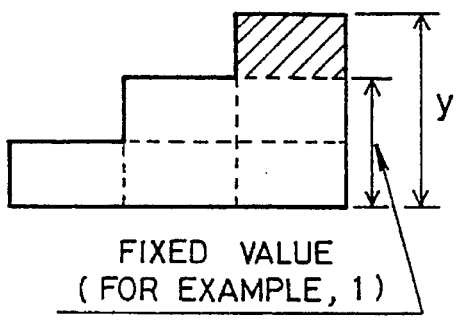
Figure 28:
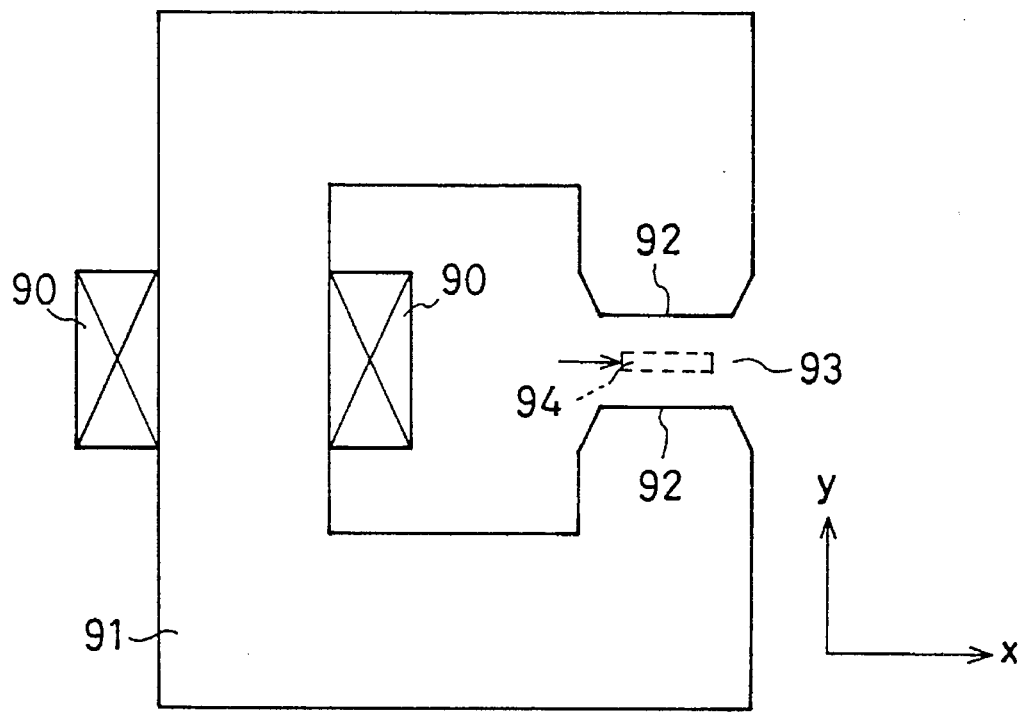
FIG. 28 is an explanatory view showing a two-dimensional analysis model of an electromagnet.
Figure 29:
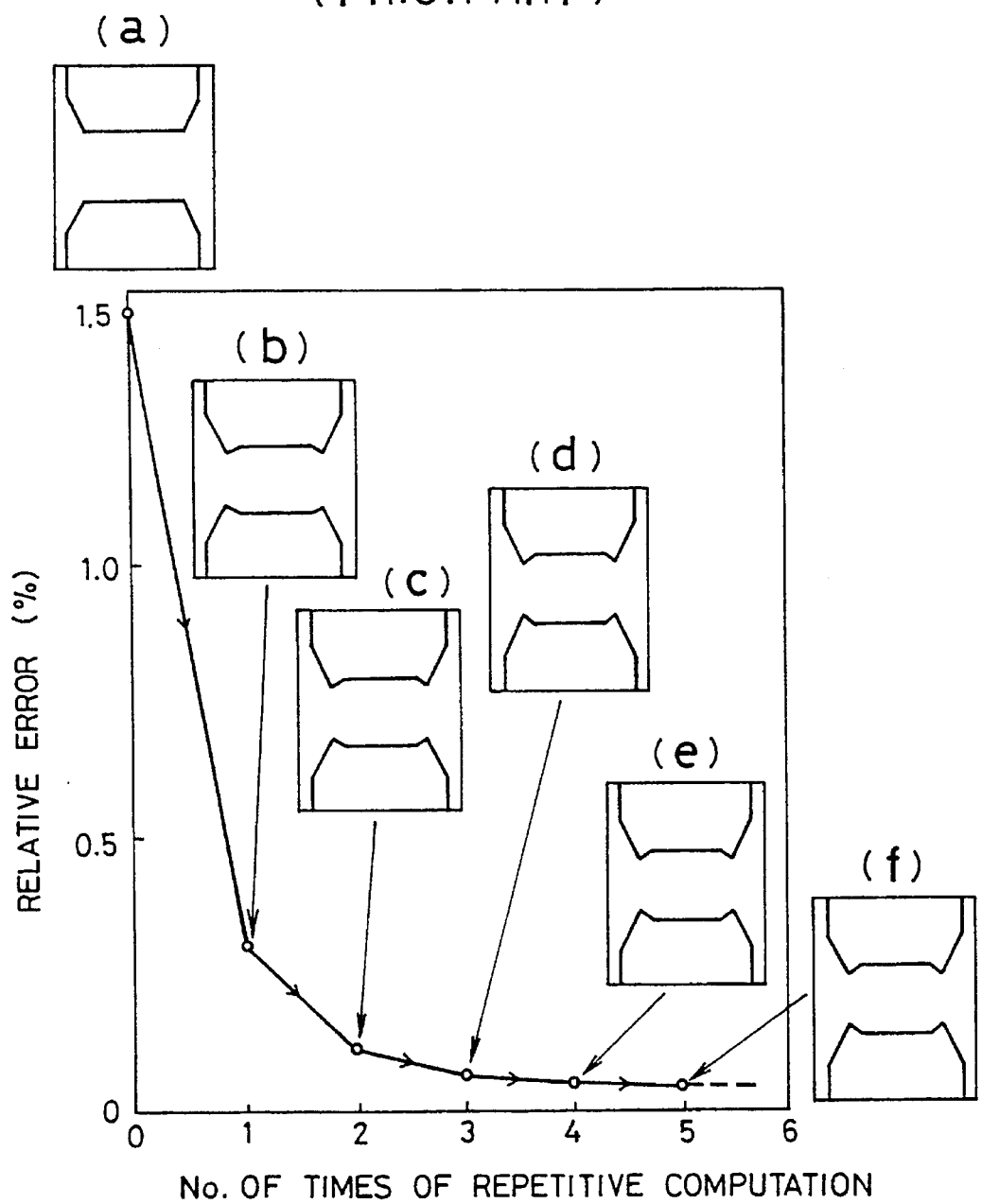
FIG. 29 is an explanatory view showing a profile of conversion of the shape of an electromagnet.
Figure 30:
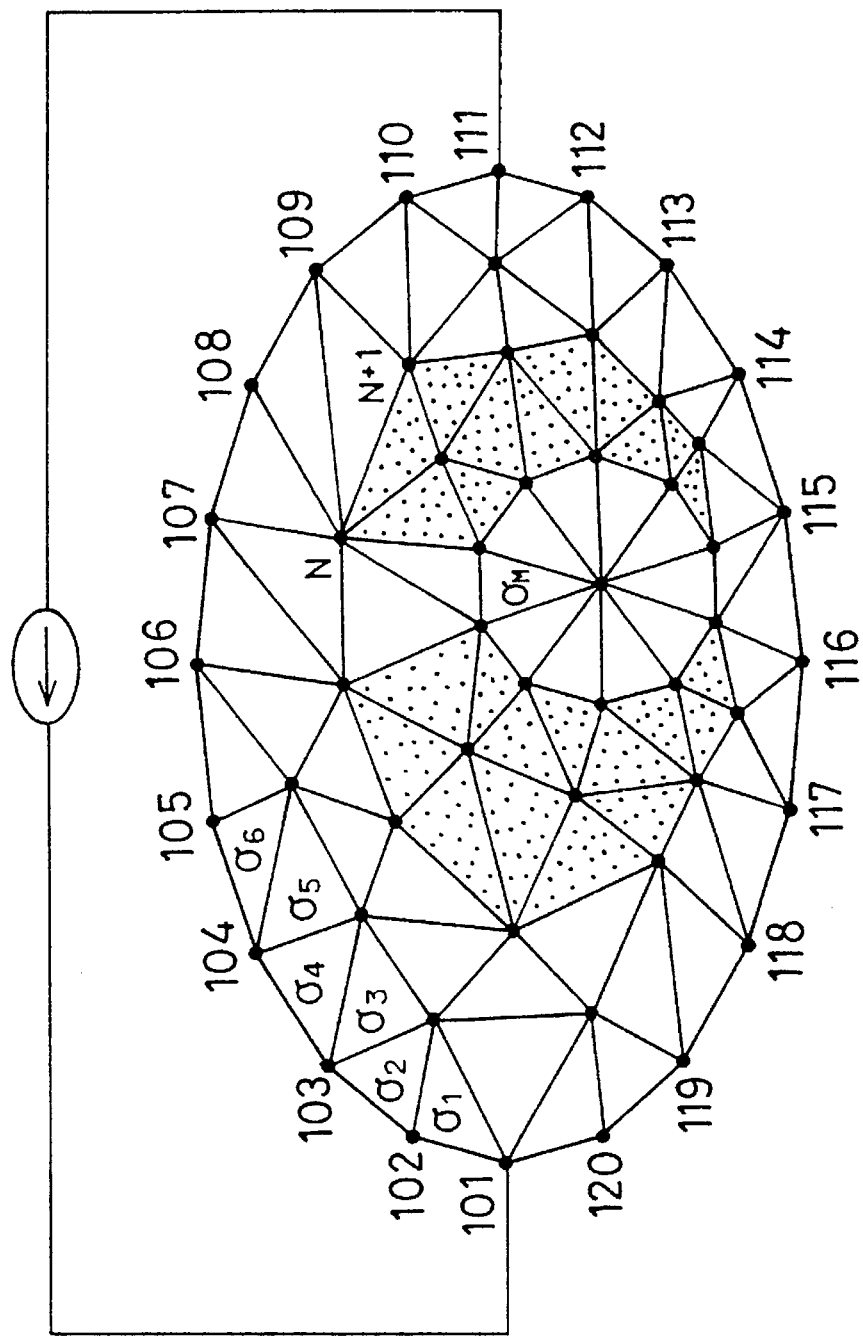
FIG. 30 is an explanatory view showing a cross-sectional model of the chest portion of an human body.
Figure 31:
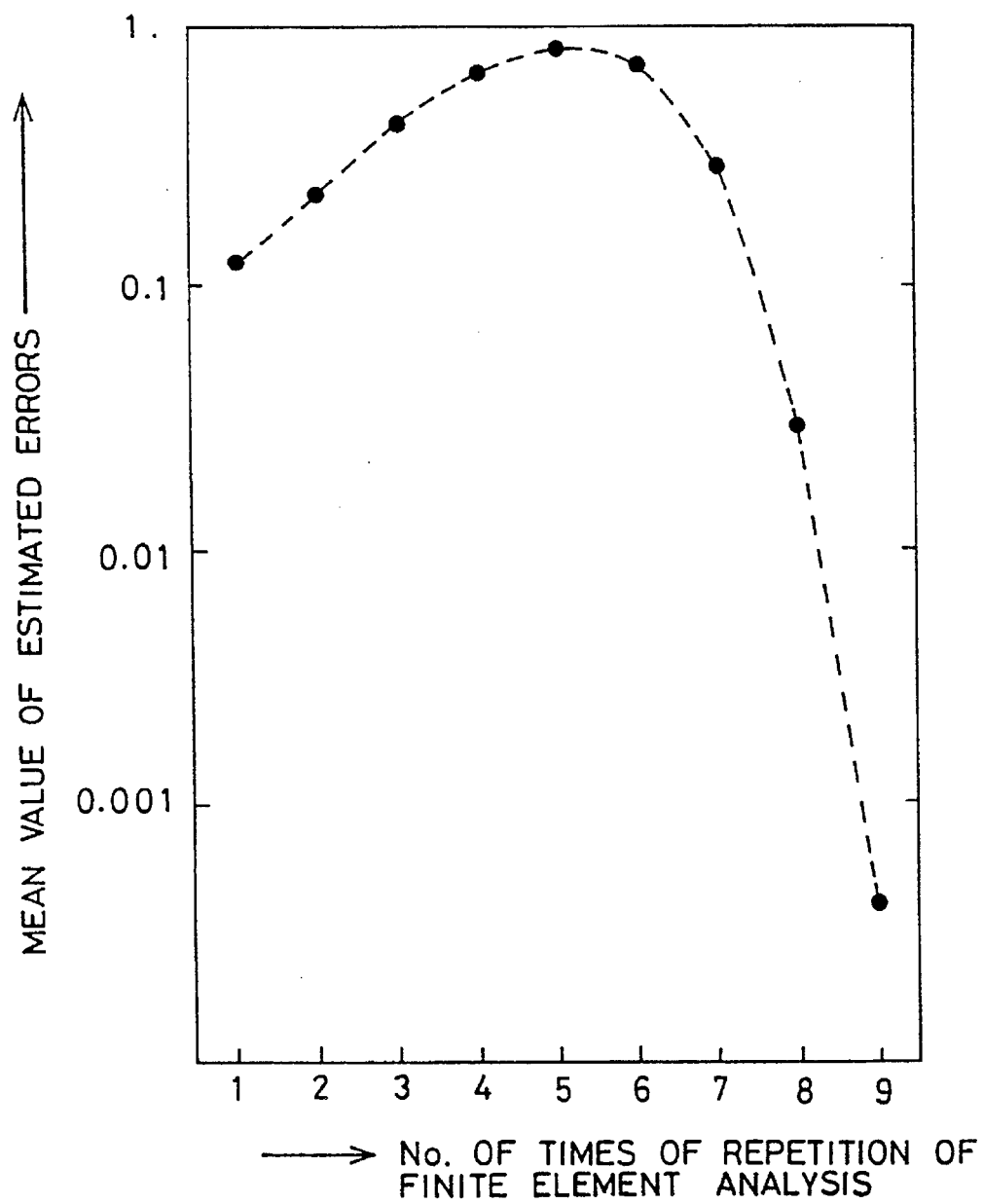
FIG. 31 is an explanatory view showing relationship between a mean value of estimated error and the number of times of repetition of analysis by the finite element method.
Figure 32:
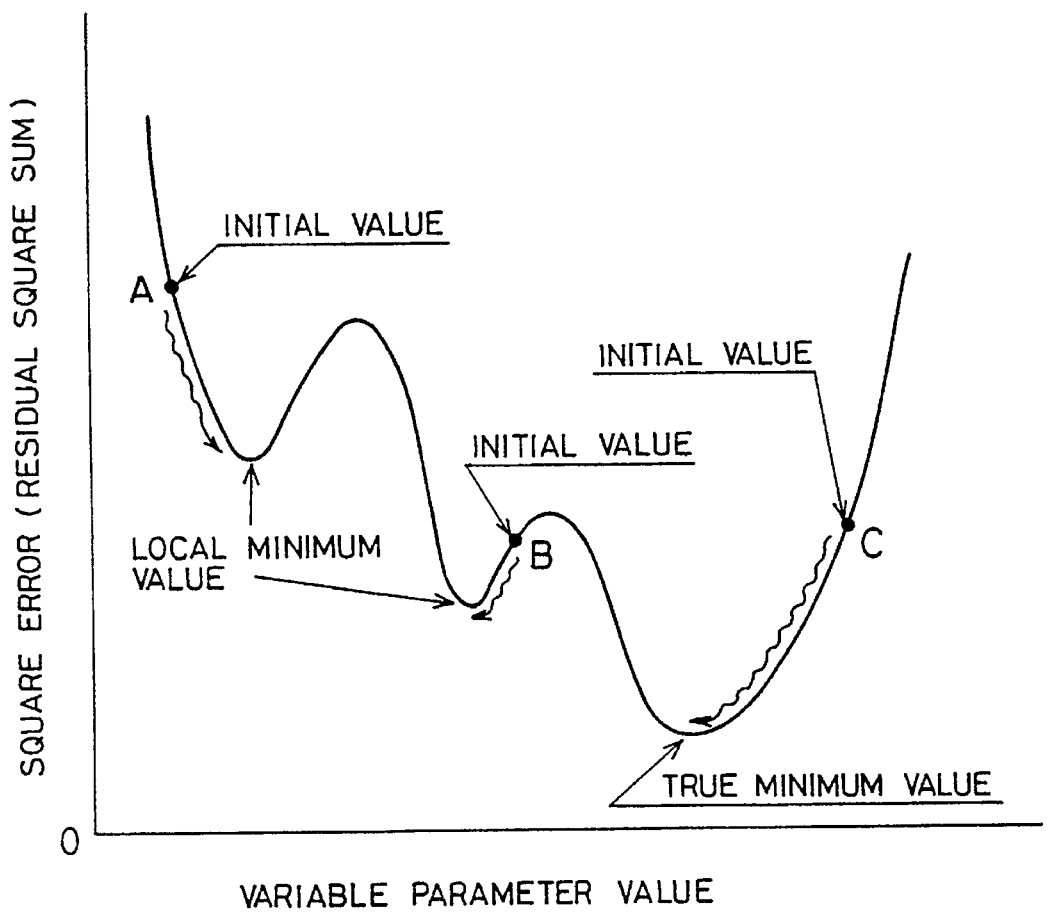
FIG. 32 is an explanatory view showing a profile allowing existence of local minimum values.

Preference of the embodiments explained above may be explained as follow. For instance, a total size of an object is expressed by a variable x and the size of each element is also expressed using x. FIG. 26(a) shows an example including three size elements where respective sizes are defined as x/3. Like the conventional system, in the method (refer to FIG. 26(b)) of obtaining a total size y of an object including the size of a fixed portion, y must be larger than 1 (y>1) and dent may be generated in the element hatched by oblique lines as y is gradually approximated to 1. However, according to the method explained with reference to FIG. 26(a), a size can be changed largely more than that when x>1. Namely, each element can be expanded or compressed with the same rate. In other words, the scope of size for designing can be expanded by applying the present invention into the design step.

As explained above, a method for controlling or determining an object system of the present invention comprises the steps of calculating a function characteristic distribution of an object including variable parameters, generating an equation by making equivalence between the function characteristic distribution to the predetermined distribution and thereby deciding parameter values for giving predetermined distribution by solving such equation. Accordingly, excellent effects can be achieved, namely the time until obtaining parameter values can be curtailed because it is no longer necessary to repeatedly execute the boundary element method and finite element method, and moreover since the intermediate calculations are carried out using symbols, drop of calculation accuracy in the course of processings can be prevented and the result having higher accuracy can be obtained. In addition, since the function characteristic distribution of an object including variable parameters can be obtained, characteristic of distribution for parameters can also be detected easily.

Moreover, since the function characteristic distribution to be evaluated can be expressed in direct terms with a function using unknown parameters such as shape and physical value, such shape and physical value which give a plurality of desired function characteristic distributions can be calculated at a time. According to the conventional method, when the design works are completed for the one function characteristic distribution, the calculation must be started again from the beginning for the other distributions. If a plurality of design targets are requested as explained above, the calculation time can be shortened remarkably when compared with that required for the conventional method.

Further, a method for controlling or determining an object system of the present invention comprises the steps of calculating a function characteristic distribution of an object including variable parameters and deciding a value for minimizing a residual square sum of the function characteristic distribution and the predetermined distribution as a parameter value. Thereby, it is no longer necessary to repeatedly execute the boundary element method or finite element method and accordingly the time until obtaining the parameter value can be shortened. Moreover, the intermediate calculations are carried out using symbols and thereby drop of calculation accuracy of the intermediate calculations can be prevented and a highly accurate result can be obtained. Moreover, it can be prevented to consider the value which is not the mimimum value as the minimum value on the occasion of minimizing the residual sum of the squares and the optimum parameter value can be determined correctly.

Moreover, for example, deviation between a design value of the area including a space and calculated value can be minimized by calculating a residual by giving weights to certain coordinates. In such a case, the plurality of residual square sums can be evaluated simultaneously (various evaluations when weights are uniform or non-uniform). According to the conventional method, evaluations have been required sequentially when the type of evaluation is different.

Furthermore, a method for estimating an object system of the present invention comprises the steps of calculating physical amount distribution of an object including variable parameters, setting an equation by making equivalence physical amount distribution and an actually measured distribution and then obtaining an estimated value of internal condition of the object by sovling the equation. Thereby, the time until obtaining the estimated value can be shortened because it is no longer necessary to repeatedly execute the boundary element method or finite element method. In addition, a drop of calculation accuracy in the intermediate calculations can be prevented and highly accurate result can be obtained because the intermediate calculations are carried out using symbols.

Still further, a method for estimating an object system of the present invention comprises the steps of calculating physical amount distribution of an object including variable parameters and obtaining a value for minimizing a residual square sum of the physical amount distribution and the actually measured distribution. Accordingly, the time until obtaining the estimated value can be shortened because it is no longer necessary to repeatedly execute the boundary element method or finite element method and drop of calculation accuracy during the processing can be prevented and highly accurate result can be obtained since the intermediate calculations are carried out using symbols. Moreover, it can be prevented to consider a minimal value which is not the minimum value as the minimum value and the optimum estimated value can be determined correctly on the occasion of minimizing the residual square sum.

What is claimed is:

1. Method of manufacturing an object by calculating material parameters or shape parameters of the object which are used for selecting a material of the object or forming a shape of the object in order to realize a required physical property distribution such as magnetic field distribution, comprising the steps of:

expressing a distribution of physical property as a function of at least one of said material parameters or shape parameters;

making equations by equating said expressed physical property distribution to said required physical property distribution;

solving said equations to calculate said material or shape parameters of the object which realize said required physical property distribution;

selecting the material of the object in accordance with said calculated material parameters; and forming the shape of the object in accordance with said calculated shape parameters.

2. Method of manufacturing an object according to claim 1, in which said step of making equations is conducted by minimizing a difference between said expressed physical property distribution and said required physical property distribution using least square method.

3. A computer readable medium containing a program for calculating material parameters or shape parameters of an object which are used for selecting a material of the object or forming a shape of the object in order to realize a required physical property distribution such as magnetic field distribution, the program including instructions for:

expressing a distribution of physical property as a function of at least one of said material parameters or said shape parameters;

making equations by equating said expressed physical property distribution to said required physical property distribution; and solving said equations to calculate said material or shape parameters of the object which realize said required physical property distribution.

4. The computer readable medium of claim 3, in which said instruction for making equations includes minimizing a difference between said expressed physical property distribution and said required physical property distribution using least square method.

5. An apparatus for calculating material parameters or shape parameters of an object which are used for selecting a material of the object or forming a shape of the object in order to realize a required physical property distribution such as magnetic field distribution, the apparatus comprising:

a programmed computer including a memory;

means for expressing a distribution of physical property as a function of at least one of said material parameters or said shape parameters;

means for making equations by equating said expressed physical property distribution to said required physical property distribution;

means for solving said equations to calculate said material or shape parameters of the object which realize said required physical property distribution; and said memory for storing said material or shape parameters.

6. An apparatus for calculating material parameters or shape parameters of an object according to claim 5, in which said means for making equations is based on a computer program which minimizes a difference between said expressed physical property distribution and said required physical property distribution using least square method.

* * * * *